United States Patent
Chow et al.

(10) Patent No.: US 8,624,364 B2
(45) Date of Patent: Jan. 7, 2014

(54) INTEGRATED CIRCUIT PACKAGING SYSTEM WITH ENCAPSULATION CONNECTOR AND METHOD OF MANUFACTURE THEREOF

(75) Inventors: Seng Guan Chow, Singapore (SG); Hin Hwa Goh, Singapore (SG); Rui Huang, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 252 days.

(21) Appl. No.: 12/714,431

(22) Filed: Feb. 26, 2010

(65) Prior Publication Data

US 2011/0210436 A1    Sep. 1, 2011

(51) Int. Cl.
*H01L 23/495* (2006.01)

(52) U.S. Cl.
USPC ........... 257/667; 257/686; 257/687; 257/738; 257/777; 257/787

(58) Field of Classification Search
USPC .......... 257/686, 687, 738, 777, 778, 787
See application file for complete search history.

(56) References Cited

U.S. PATENT DOCUMENTS

| | | | | |
|---|---|---|---|---|
| 4,843,036 A | * | 6/1989 | Schmidt et al. | 438/64 |
| 5,218,234 A | * | 6/1993 | Thompson et al. | 257/787 |
| 5,311,059 A | * | 5/1994 | Banerji et al. | 257/778 |
| 5,436,203 A | * | 7/1995 | Lin | 29/841 |
| 5,477,082 A | * | 12/1995 | Buckley et al. | 257/679 |
| 6,229,215 B1 | | 5/2001 | Egawa | |
| 6,404,062 B1 | | 6/2002 | Taniguchi et al. | |
| 7,432,602 B2 | | 10/2008 | Kuramochi | |
| 7,462,508 B2 | | 12/2008 | Lee | |
| 7,528,007 B2 | | 5/2009 | Fee et al. | |
| 7,573,136 B2 | | 8/2009 | Jiang et al. | |

* cited by examiner

*Primary Examiner* — Ori Nadav
(74) *Attorney, Agent, or Firm* — Ishimaru & Associates LLP

(57) ABSTRACT

An integrated circuit packaging system includes: a base integrated circuit package having a base integrated circuit on a base substrate thereof; a base barrier on the base substrate adjacent a base perimeter of the base substrate; a stack substrate over the base substrate, the stack substrate having a stack substrate aperture with the stack substrate having an inter-substrate connector thereon; a connector underfill through the stack substrate aperture encapsulating the inter-substrate connector, overflow of the connector underfill prevented by the base barrier; and a cavity formed of the stack substrate, the base integrated circuit package, and the connector underfill, the cavity horizontally offset from the base barrier.

20 Claims, 9 Drawing Sheets ly to an integrated
INTEGRATED CIRCUIT PACKAGING SYSTEM WITH ENCAPSULATION CONNECTOR AND METHOD OF MANUFACTURE THEREOF

TECHNICAL FIELD

The present invention relates general circuit packaging system, and more particularly to a system for an integrated circuit packaging system with encapsulation.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for performance, integration, and cost reduction.

Thus, a need still remains for an integrated circuit packaging system providing improved chip interconnection, space savings, and low cost manufacturing. In view of the ever-increasing need to improve performance, integration, and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; attaching a base integrated circuit on the base substrate; attaching a base barrier on the base substrate adjacent a base perimeter thereof; mounting a stack substrate over the base substrate, the stack substrate having a stack substrate aperture with the stack substrate having an inter-substrate connector thereon; and dispensing a connector underfill through the stack substrate aperture encapsulating the inter-substrate connector, overflow of the connector underfill prevented by the base barrier.

The present invention provides an integrated circuit packaging system, including: a base substrate; a base integrated circuit on the base substrate; a base barrier on the base substrate adjacent a base perimeter thereof; a stack substrate over the base substrate, the stack substrate having a stack substrate aperture with the stack substrate having an inter-substrate connector thereon; and a connector underfill through the stack substrate aperture encapsulating the inter-substrate connector, overflow of the connector underfill prevented by the base barrier.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
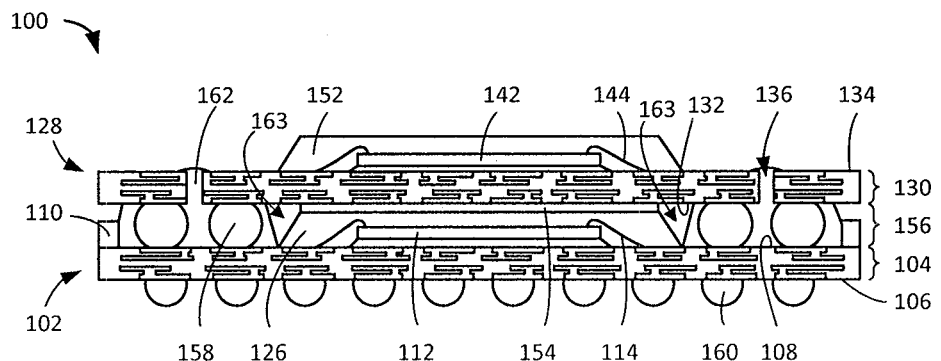
FIG. 1 is a cross-sectional view of an integrated circuit packaging system along a section line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

There are increasing expectation and requirements for semiconductor devices having better mechanical performance, especially for hand held and portable device applications. In current package-on-package (PoP) structures, solder interconnects of a top package can be directly exposed to environment without any reinforcement layers.

The solder interconnects can have joints that are not sufficiently robust to cope with reliability test requirements such as temperature cycling tests or mechanical impact tests. The current PoP structures are not amenable or not readily complied to introduce the reinforcement layers (e.g. underfill materials) in the package-to-package standoff gap, particularly for PoP stacking structures that have same sizes.

The current PoP structures can be mounted on printed circuit boards (PCBs) with underfill tongues formed around the PCBs' peripheries. Long underfill overspreads (or tongues) can be formed around the peripheries of the current PoP structures if conventional dispensing techniques are employed to provide underfill materials between inter-package standoff gaps and the current PoP structures' board-level mounting standoff gaps.

The current PoP structures have a number of disadvantages or problems. The problems can include a high amount of wasted underfill materials, a long dispensing time for double-layer standoff gaps, or a large PCB keep-out zone required to accommodate the long underfill overspreads.

Additional problems that need to be addressed can include inadequate thermal performance of top packages in the current PoP structures, since peripheral balls can insufficiently or ineffectively dissipate heat through substrates of bottom packages in the current PoP structures. Embodiments of the present invention provide answers or solutions to these problems by providing various form factors, which can include ascending, descending, or straight profile in structure.

Figure 2:
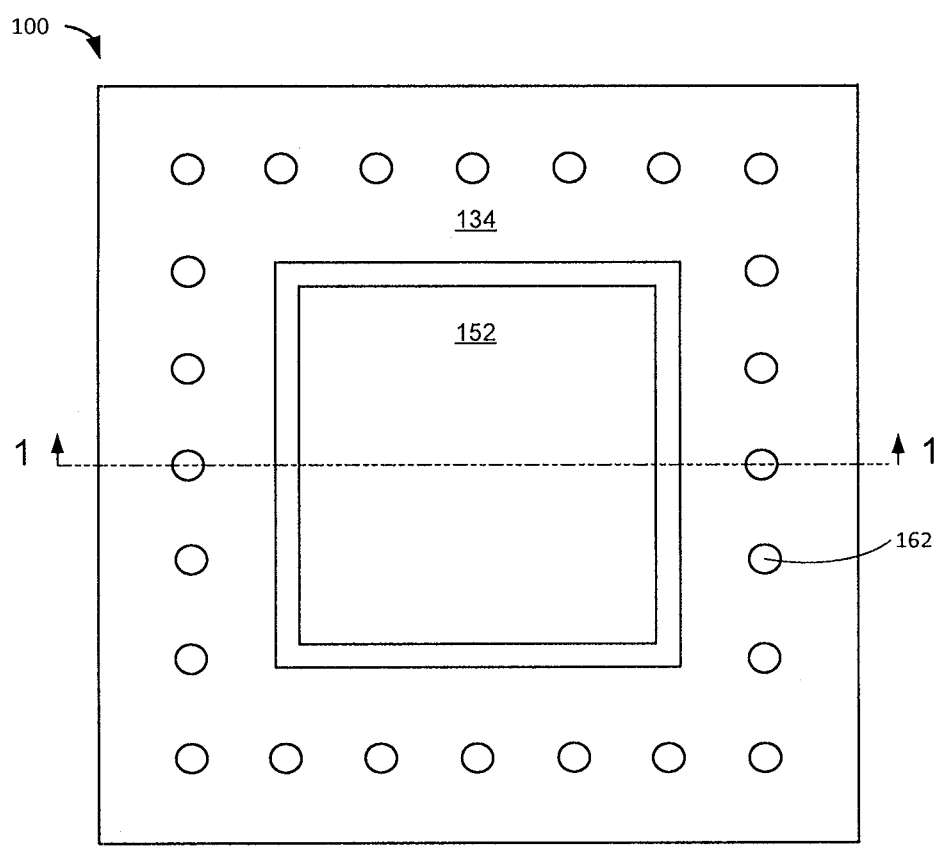
FIG. 2 is a top view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can represent a configuration of a packaging system, which can include a pre-stacked package-on-package (PoP) with an underfill encapsulant interposed between packages or in an inter-package standoff gap.

The integrated circuit packaging system 100 can include a base integrated circuit package 102. The base integrated circuit package 102 can include a base substrate 104, such as a laminated plastic or ceramic substrate, an organic or inorganic substrate, a carrier, a printed circuit board (PCB), or a printed wiring substrate. The base substrate 104 can include bond sites, conductive layers, wiring layers, or traces, to provide electrical connectivity.

The base substrate 104 can include a base substrate bottom surface 106 and a base substrate top surface 108 on a side of the base substrate 104 opposite the base substrate bottom surface 106. The base integrated circuit package 102 can include a base barrier 110 defined as a dam or a structure formed to contain or prevent the underfill encapsulation from overflowing over sides of the base substrate 104. The base barrier 110 can be formed with an epoxy resin, a photoresist, or a solder mask.

The base integrated circuit package 102 can provide the base substrate 104 to mount a base integrated circuit 112, such as an integrated circuit die, a wirebond integrated circuit, or a chip, thereon. The base integrated circuit 112 can be mounted over, on, or attached to the base substrate top surface 108 with an attach layer, such as a die attach, an adhesive, a film, or an epoxy. The base integrated circuit package 102 can include a base internal interconnect 114, such as a bond wire, a ribbon bond wire, or a conductive wire, attached or connected to the base substrate top surface 108 and the base integrated circuit 112.

The base integrated circuit package 102 can include a base encapsulation 126, such as a cover including an epoxy molding compound, an encapsulant, or a molding material. The base encapsulation 126 can include a taper side that is slanted to facilitate a release of a mold system in a molding process of the base encapsulation 126.

The base encapsulation 126 can be formed over the base substrate 104, partially covering the base substrate top surface 108. The base encapsulation 126 can be formed over the base integrated circuit 112 and the base internal interconnect 114.

The integrated circuit packaging system 100 can include a stack integrated circuit package 128 mounted over the base integrated circuit package 102. The stack integrated circuit package 128 can include a stack substrate 130, such as a laminated plastic or ceramic substrate, an organic or inorganic substrate, a carrier, a printed circuit board (PCB), or a printed wiring substrate. The stack substrate 130 can include bond sites, conductive layers, wiring layers, or traces, to provide electrical connectivity.

The stack substrate 130 can include a stack substrate bottom surface 132 and a stack substrate top surface 134 on a side of the stack substrate 130 opposite the stack substrate bottom surface 132. The stack substrate 130 can include a stack substrate aperture 136 defined as a through slot or an opening. The stack substrate aperture 136 can be formed through the stack substrate 130, between the stack substrate bottom surface 132 and the stack substrate top surface 134.

The stack integrated circuit package 128 can include a stack device 142, such as an integrated circuit die, a wirebond integrated circuit, or a chip, mounted over the stack substrate 130. The stack device 142 can be attached to the stack substrate 130 with another attach layer, such as a die attach, an adhesive, a film, or an epoxy. The stack integrated circuit package 128 can include a stack device internal interconnect 144, such as a bond wire, a ribbon bond wire, or a conductive wire, attached or connected to the stack substrate 130 and the stack device 142.

The stack integrated circuit package 128 can include a stack encapsulation 152, such as a cover including an epoxy molding compound, an encapsulant, or a molding material. The stack encapsulation 152 can include a taper side that is slanted to facilitate a release of a mold system in a molding process of the stack encapsulation 152.

The stack encapsulation 152 can be formed over the stack substrate 130, partially covering the stack substrate top surface 134. The stack encapsulation 152 can be formed over the stack device 142 and the stack device internal interconnect 144.

The integrated circuit packaging system 100 can include a thermal interface layer 154, such as a thermal interface material (TIM), a mastic material, a cement, an adhesive, or a material that can be pasted or filled in gaps between thermal transfer surfaces. For example, the thermal interface layer 154 can include a phase-change material or a thermal pad. Also for example, the thermal interface layer 154 can include thermal grease or thermal paste.

The thermal interface layer 154 can optionally be pre-applied to increase thermal transfer efficiency. The thermal interface layer 154 can be deposited between or attached to a top surface of the base encapsulation 126 and the stack substrate bottom surface 132.

The integrated circuit packaging system 100 can include an inter-substrate region 156 defined as spacing between the base substrate 104 and the stack substrate 130. The inter-substrate region 156 can include spacing between the base substrate top surface 108 and the stack substrate bottom surface 132.

The inter-substrate region 156 can include spacing for the base encapsulation 126, the thermal interface layer 154, or a combination thereof. The inter-substrate region 156 can include the inter-package standoff gap.

The integrated circuit packaging system 100 can include an inter-substrate connector 158, such as a solder ball, a stud bump, a solder column, a metal conductor, or a metallic alloy conductor. The inter-substrate connector 158 can be formed in the inter-substrate region 156. The inter-substrate connector 158 can be formed between the base barrier 110 and the base integrated circuit 112.

The inter-substrate connector 158 can be attached to, attached on, or connected to the base substrate top surface 108 and the stack substrate bottom surface 132. The stack substrate 130 can be attached to, attached on, connected to, or connected on the inter-substrate connector 158.

With the inter-substrate connector 158 attached to the stack substrate bottom surface 132, electrical tests can be performed for the stack integrated circuit package 128. The stack integrated circuit package 128 can be attached to the base substrate 104 with the inter-substrate connector 158.

The inter-substrate connector 158 can be formed in an area array around or along a base perimeter of the base substrate 104 or a stack perimeter of the stack substrate 130. The inter-substrate connector 158 can be formed around or adjacent the base encapsulation 126. The inter-substrate connector 158 can be formed adjacent the base barrier 110.

The integrated circuit packaging system 100 can include an external interconnect 160, such as a solder ball, a stud bump, a solder column, a metal conductor, or a metallic alloy conductor, attached to the base substrate bottom surface 106. The external interconnect 160 can be formed on the base substrate bottom surface 106, providing electrical connectivity to external systems. The external interconnect 160 can be formed in a full area array.

The integrated circuit packaging system 100 can include a connector underfill 162, such as a resin, an encapsulant, an epoxy, an underfill, a liquid encapsulant, or the underfill encapsulant. The connector underfill 162 can function as a reinforcement layer in the inter-substrate region 156, providing protection for the inter-substrate connector 158. The connector underfill 162 can be formed with board-level underfill processes, which can be readily performed by surface mount technology (SMT) manufacturers for pre-stacked PoP systems.

The integrated circuit packaging system 100 can include a descending structure profile such that the stack substrate 130, having the stack substrate aperture 136 to facilitate the dispensing process, is over the base substrate 104 that is attached to the external interconnect 160. As such, the connector underfill 162 can be dispensed with top side dispensing methods from a top surface of a packaging system. For example, the top side dispensing methods can be performed with the connector underfill 162 dispensed through the stack substrate aperture 136 from the stack substrate top surface 134.

The inter-substrate region 156 can be optionally pre-deposited with the connector underfill 162. As such, SMT manufacturers can perform the underfill process only to the external interconnect 160 upon mounting the integrated circuit packaging system 100 on the board. Therefore, the complicated underfill process for multi-level standoff gaps can be avoided.

The connector underfill 162 can be filled or dispensed with a dispenser or any encapsulation method during manufacturing processes, which can include dispensing guns, cartridges, syringes, needle tips, or spreaders, as examples. The connector underfill 162 can be filled through the stack substrate aperture 136. The connector underfill 162 can encapsulate the inter-substrate connector 158 and joints or junctions where the inter-substrate connector 158 is attached or connected to the base substrate 104 and the stack substrate 130 in the inter-substrate region 156. The connector underfill 162 has a cavity 163, horizontally offset away from the base barrier and towards the base integrated circuit 112. The cavity 163 of the connector underfill 162 can be bounded by the stack substrate bottom surface 132 of the stack substrate 130 and surfaces of the base integrated circuit package 102 that include portions of the base encapsulation 126. The cavity 163 of the connector underfill 162 can also be sealed by a portion of the thermal interface layer 154.

For illustrative purposes, the cross-sectional view is shown with a portion of the connector underfill 162 formed over the stack substrate top surface 134, although it is understood that the connector underfill 162 can be formed through the stack substrate aperture 136 up to the stack substrate top surface 134 after the dispensing process. In other words, the connector underfill 162 can be formed such that an exposed surface of the connector underfill 162 can be substantially coplanar with the stack substrate top surface 134 after the dispensing process.

The integrated circuit packaging system 100, having the stack substrate aperture 136 to facilitate encapsulation or dispensing of the connector underfill 162, can enhance the mechanical integrity including temperature cycling test reliability, mechanical shock/impact resistance performance, or better warpage control. The connector underfill 162 can also improve thermal performance of the integrated circuit packaging system 100.

The base barrier 110 can be mounted over, on, or attached to the base substrate top surface 108 to prevent overspill. The base barrier 110 can be formed adjacent or along the base perimeter to prevent the connector underfill 162 from overflowing over edges of the base substrate 104.

As an example, the base barrier 110 can include a closed loop structure that is contiguously formed around the base perimeter. As another example, the base barrier 110 can include a segmental structure that is partially formed around the base perimeter.

The stack substrate aperture 136 can be strategically or selectively formed near or at a peripheral area of the stack substrate 130. For example, the stack substrate aperture 136 can be selectively formed at or near corners of the stack substrate 130 to encapsulate the inter-substrate connector 158 that are critical.

It has been discovered that the connector underfill 162, the stack substrate aperture 136, the inter-substrate connector 158, and the base barrier 110 significantly improves mechanical integrity of the integrated circuit packaging system 100, providing better warpage control and improved solder joint reliability based on thermal cycling tests and mechanical drop impact tests.

It has also been discovered that encapsulating the inter-substrate connector 158 with the connector underfill 162 is significantly better in rheological control consistently providing void-free coverage performance.

It has further been discovered that the connector underfill 162 or the thermal interface layer 154 significantly enhances thermal dissipation of the integrated circuit packaging system 100.

Further it has been discovered that pre-depositing the connector underfill 162 in the inter-substrate region 156 greatly enhances the underfill process thereby eliminating complicated underfill processes for multi-level standoff gaps.

Referring now to FIG. 2, therein is shown a top view of the integrated circuit packaging system 100. The integrated circuit packaging system 100 can include the stack encapsulation 152 formed over a portion of the stack substrate top surface 134. The integrated circuit packaging system 100 can include a portion of the connector underfill 162 dispensed over the stack substrate top surface 134, adjacent or around the stack encapsulation 152.

Figure 3:
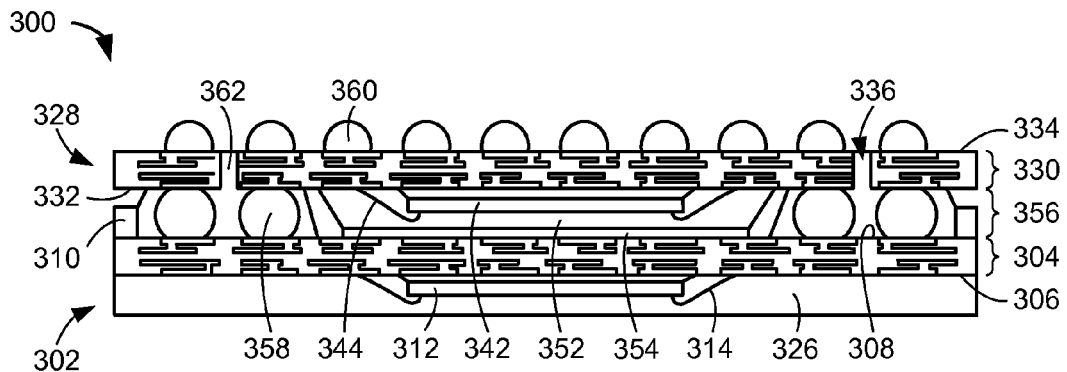
FIG. 3 is a cross-sectional view of an integrated circuit packaging system along a section line 3-3 of FIG. 4 in a second embodiment of the present invention.
Figure 4:
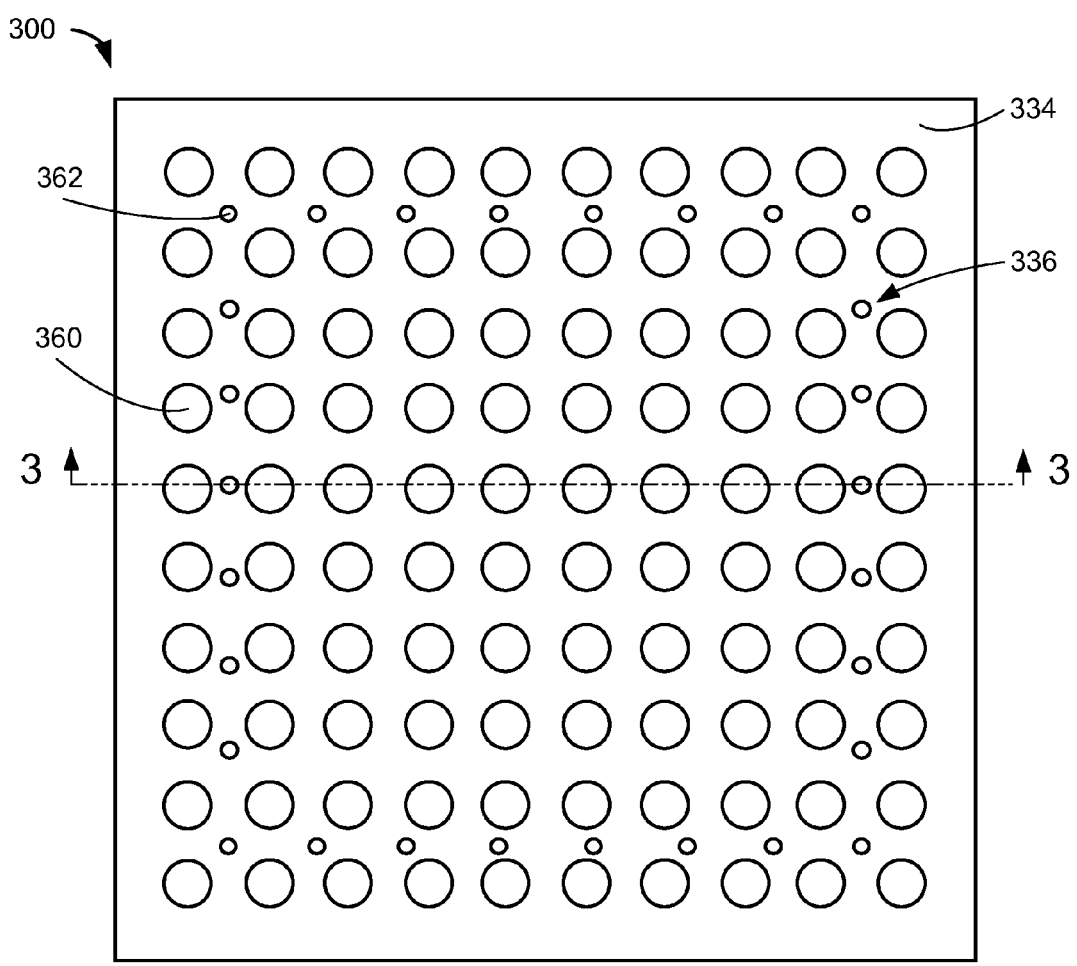
FIG. 4 is a top view of the integrated circuit packaging system.

Referring now to FIG. 3, therein is shown a cross-sectional view of an integrated circuit packaging system 300 along a section line 3-3 of FIG. 4 in a second embodiment of the present invention. The integrated circuit packaging system 300 can represent a configuration of a packaging system, which can include a pre-stacked package-on-package (PoP) with an underfill encapsulant interposed between packages or in an inter-package standoff gap.

The integrated circuit packaging system 300 can be similar to the integrated circuit packaging system 100 of FIG. 1, except for the formation of the stack substrate aperture 136 of FIG. 1 and the base barrier 110 of FIG. 1 and that the integrated circuit packaging system 100 is inverted.

The integrated circuit packaging system 300 can include a base integrated circuit package 302. The base integrated circuit package 302 can include a base substrate 304, such as a laminated plastic or ceramic substrate, an organic or inorganic substrate, a carrier, a printed circuit board (PCB), or a printed wiring substrate. The base substrate 304 can include bond sites, conductive layers, wiring layers, or traces, to provide electrical connectivity.

The base substrate 304 can include a base substrate bottom surface 306 and a base substrate top surface 308 on a side of the base substrate 304 opposite the base substrate bottom surface 306. The base integrated circuit package 302 can include a base barrier 310 defined as a dam or a structure formed to contain or prevent the underfill encapsulation from overflowing over sides of the base substrate 304. The base barrier 310 can be formed with an epoxy resin, a photoresist, or a solder mask.

The base integrated circuit package 302 can provide the base substrate 304 to mount a base integrated circuit 312, such as an integrated circuit die, a wirebond integrated circuit, or a chip, thereon. The base integrated circuit 312 can be mounted over or attached to the base substrate bottom surface 306 with an attach layer, such as a die attach, an adhesive, a film, or an epoxy. The base integrated circuit package 302 can include a base internal interconnect 314, such as a bond wire, a ribbon bond wire, or a conductive wire, attached or connected to the base substrate bottom surface 306 and the base integrated circuit 312.

The base integrated circuit package 302 can include a base encapsulation 326, such as a cover including an epoxy molding compound, an encapsulant, or a molding material. The base encapsulation 326 can be formed over the base substrate 304, the base integrated circuit 312, and the base internal interconnect 314.

The integrated circuit packaging system 300 can include a stack integrated circuit package 328 mounted over the base integrated circuit package 302. The stack integrated circuit package 328 can include a stack substrate 330, such as a laminated plastic or ceramic substrate, an organic or inorganic substrate, a carrier, a printed circuit board (PCB), or a printed wiring substrate. The stack substrate 330 can include bond sites, conductive layers, wiring layers, or traces, to provide electrical connectivity.

The stack substrate 330 can include a stack substrate bottom surface 332 and a stack substrate top surface 334 on a side of the stack substrate 330 opposite the stack substrate bottom surface 332. The stack substrate 330 can include a stack substrate aperture 336 defined as a through slot or an opening. The stack substrate aperture 336 can be formed through the stack substrate 330, between the stack substrate bottom surface 332 and the stack substrate top surface 334.

The stack integrated circuit package 328 can include a stack device 342, such as an integrated circuit die, a wirebond integrated circuit, or a chip, mounted over the stack substrate 330. The stack device 342 can be attached to the stack substrate bottom surface 332 with another attach layer, such as a die attach, an adhesive, a film, or an epoxy. The stack integrated circuit package 328 can include a stack device internal interconnect 344, such as a bond wire, a ribbon bond wire, or a conductive wire, attached or connected to the stack substrate bottom surface 332 and the stack device 342.

The stack integrated circuit package 328 can include a stack encapsulation 352, such as a cover including an epoxy molding compound, an encapsulant, or a molding material. The stack encapsulation 352 can include a taper side that is slanted to facilitate a release of a mold system in a molding process of the stack encapsulation 352.

The stack encapsulation 352 can be formed over the stack substrate 330, partially covering the stack substrate bottom surface 332. The stack encapsulation 352 can be formed over the stack device 342 and the stack device internal interconnect 344.

The integrated circuit packaging system 300 can include a thermal interface layer 354, such as a thermal interface material (TIM), a mastic material, a cement, an adhesive, or a material that can be pasted or filled in gaps between thermal transfer surfaces. For example, the thermal interface layer 354 can include a phase-change material or a thermal pad. Also for example, the thermal interface layer 354 can include thermal grease or thermal paste.

The thermal interface layer 354 can optionally be pre-applied to increase thermal transfer efficiency. The thermal interface layer 354 can be deposited between or attached to the base substrate top surface 308 and the stack encapsulation 352.

The integrated circuit packaging system 300 can include an inter-substrate region 356 defined as spacing between the base substrate 304 and the stack substrate 330. The inter-substrate region 356 can include spacing between the base substrate top surface 308 and the stack substrate bottom surface 332.

The inter-substrate region 356 can include spacing for the stack encapsulation 352, the thermal interface layer 354, or a combination thereof. The inter-substrate region 356 can include the inter-package standoff gap.

The integrated circuit packaging system 300 can include an inter-substrate connector 358, such as a solder ball, a stud bump, a solder column, a metal conductor, or a metallic alloy conductor. The inter-substrate connector 358 can be formed in the inter-substrate region 356. The inter-substrate connector 358 can be attached or connected to the base substrate top surface 308 and the stack substrate bottom surface 332.

The inter-substrate connector 358 can be formed in an area array around or along a base perimeter of the base substrate 304 or a stack perimeter of the stack substrate 330. The inter-substrate connector 358 can be formed around or adjacent the stack encapsulation 352. The inter-substrate connector 358 can be formed adjacent the base barrier 310.

The integrated circuit packaging system 300 can include an external interconnect 360, such as a solder ball, a stud bump, a solder column, a metal conductor, or a metallic alloy conductor, attached to the stack substrate top surface 334. The external interconnect 360 can be formed on the stack substrate top surface 334 to provide electrical connectivity to external systems. The external interconnect 360 can be formed in a full area array.

The integrated circuit packaging system 300 can include a connector underfill 362, such as a resin, an encapsulant, an epoxy, an underfill, a liquid encapsulant, or the underfill encapsulant. The connector underfill 362 can function as a reinforcement layer in the inter-substrate region 356, providing protection for the inter-substrate connector 358. The connector underfill 362 can be formed with board-level underfill processes, which can be readily performed by surface mount technology (SMT) manufacturers for pre-stacked PoP systems.

The integrated circuit packaging system 300 can include an ascending structure profile such that the stack substrate 330, having the stack substrate aperture 336 to facilitate the dispensing process, is attached to the external interconnect 360 and over the base substrate 304. As such, the connector underfill 362 can be dispensed with bottom side dispensing methods from a bottom surface of a packaging system. For example, the bottom side dispensing methods can be performed with the connector underfill 362 dispensed through the stack substrate aperture 336 from the stack substrate top surface 334, where the external interconnect 360 is attached thereto.

The inter-substrate region 356 can be optionally pre-deposited with the connector underfill 362. As such, SMT manufacturers can perform the underfill process only to the external interconnect 360 upon mounting the integrated circuit packaging system 300 on the board. Therefore, the complicated underfill process for multi-level standoff gaps can be avoided.

The connector underfill 362 can be filled or dispensed with a dispenser or any encapsulation method during manufacturing processes, which can include dispensing guns, cartridges, syringes, needle tips, or spreaders, as examples. The connector underfill 362 can be filled through the stack substrate aperture 336. The connector underfill 362 can encapsulate the inter-substrate connector 358 and joints or junctions where the inter-substrate connector 358 is attached or connected to the base substrate 304 and the stack substrate 330 in the inter-substrate region 356.

For illustrative purposes, the cross-sectional view is shown with an exposed surface of the connector underfill 362 substantially coplanar with the stack substrate top surface 334 after the dispensing process, although it is understood that a portion of the connector underfill 362 can be formed over the stack substrate top surface 334.

The base barrier 310 can be mounted over or attached to the base substrate top surface 308 to prevent overspill. The base barrier 310 can be formed adjacent or along the base perimeter, preventing the connector underfill 362 from flowing over edges of the base substrate 304.

As an example, the base barrier 310 can include a closed loop structure that is contiguously formed around the base perimeter. As an example, the base barrier 310 can include a segmental structure that is partially formed around the base perimeter.

The stack substrate aperture 336 can be strategically or selectively formed near or at a peripheral area of the stack substrate 330. For example, the stack substrate aperture 336 can be selectively formed at or near corners of the stack substrate 330 to encapsulate the inter-substrate connector 358 that are critical. To facilitate the underfill encapsulation process, the external interconnect 360 can be attached to the stack substrate 330 after dispensing the connector underfill 362.

It has been discovered that the integrated circuit packaging system 300 with the stack substrate 330, having the external interconnect 360 attached thereto and the stack substrate aperture 336, greatly enhances the underfill encapsulation process using the bottom side dispensing methods.

Referring now to FIG. 4, therein is shown a top view of the integrated circuit packaging system 300. The top view is shown with the stack substrate 330 of FIG. 3 having the stack substrate aperture 336 formed on the stack substrate top surface 334.

The integrated circuit packaging system 300 can include the connector underfill 362 dispensed in the stack substrate aperture 336 around the stack perimeter. The integrated circuit packaging system 300 can include the external interconnect 360 formed on the stack substrate top surface 334. The external interconnect 360 can be formed in a full area array.

Figure 5:
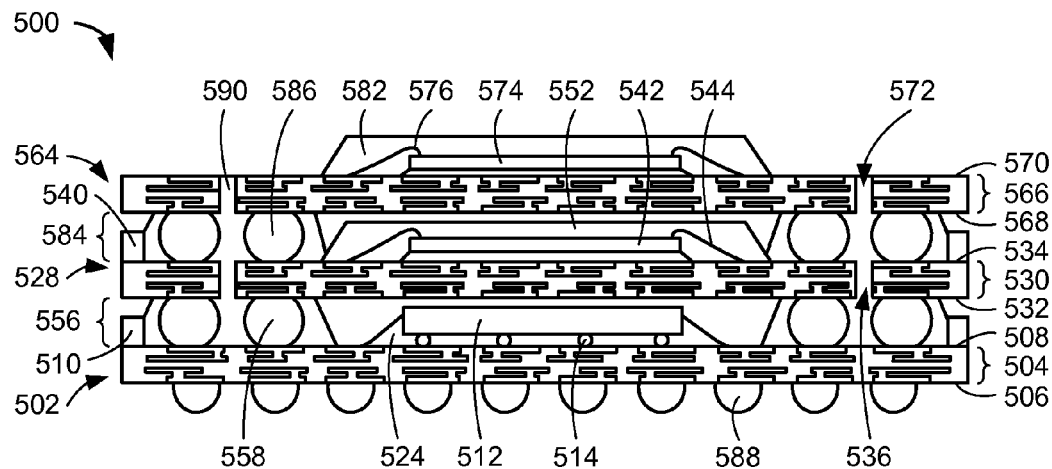
FIG. 5 is a cross-sectional view similar to FIG. 1 of an integrated circuit packaging system in a third embodiment of the present invention.

Referring now to FIG. 5, therein is shown a cross-sectional view similar to FIG. 1 of an integrated circuit packaging system 500 in a third embodiment of the present invention. The integrated circuit packaging system 500 can be similar to the integrated circuit packaging system 100 of FIG. 1, except for the formation of the base integrated circuit package 102 of FIG. 1 and the stack integrated circuit package 128 of FIG. 1 and an addition of another package.

The integrated circuit packaging system 500 can represent a configuration of a packaging system, which can include a multi-layer pre-stacked package-on-package (PoP) structure with various package types and an underfill encapsulant interposed between packages or in inter-package standoff gaps.

The integrated circuit packaging system 500 can include a base integrated circuit package 502. The base integrated circuit package 502 can include a base substrate 504, having a base substrate bottom surface 506 and a base substrate top surface 508, and a base barrier 510. The base substrate 504 and the base barrier 510 can be formed in a manner similar to the base substrate 104 of FIG. 1 and the base barrier 110 of FIG. 1, respectively.

The base integrated circuit package 502 can provide the base substrate 504 to mount a base integrated circuit 512, such as a flip chip, a die, or a bumped chip, thereon. The base integrated circuit 512 can be attached or connected to the base substrate top surface 508 with a base internal interconnect 514, such as a solder ball, a stud bump, a solder column, a metal conductor, or a metallic alloy conductor. The base integrated circuit package 502 can include a base underfill 524, such as an epoxy resin or any underfill resin material, dispensed in the space between the base substrate top surface 508 and the base integrated circuit 512 to protect the base internal interconnect 514.

The integrated circuit packaging system 500 can include a stack integrated circuit package 528 mounted over the base integrated circuit package 502. The stack integrated circuit package 528 can include a stack substrate 530, having a stack substrate bottom surface 532, a stack substrate top surface 534, and a stack substrate aperture 536, formed in a manner similar to the stack substrate 130 of FIG. 1.

The stack integrated circuit package 528 can include a stack barrier 540 defined as a dam or a structure formed to contain or prevent the underfill encapsulation from overflowing over sides of the stack substrate 530. The stack barrier 540 can be formed with an epoxy resin, a photoresist, or a solder mask.

The stack integrated circuit package 528 can include a stack device 542, a stack device internal interconnect 544, and a stack encapsulation 552, formed in a manner similar to the stack device 142 of FIG. 1, the stack device internal interconnect 144 of FIG. 1, and the stack encapsulation 152 of FIG. 1, respectively.

The integrated circuit packaging system 500 can include an inter-substrate region 556 defined as an inter-package standoff gap or spacing between the base substrate 504 and the stack substrate 530. The inter-substrate region 556 can include spacing between the base substrate top surface 508 and the stack substrate bottom surface 532. The inter-substrate region 556 can include spacing for the base integrated circuit 512, the base internal interconnect 514, or any spacing between the base integrated circuit 512 and the stack substrate bottom surface 532.

The integrated circuit packaging system 500 can include an inter-substrate connector 558, such as a solder ball, a stud bump, a solder column, a metal conductor, or a metallic alloy conductor. The inter-substrate connector 558 can be attached or connected to the base substrate top surface 508 and the stack substrate bottom surface 532.

The inter-substrate connector 558 can be formed in an area array around or along a base perimeter of the base substrate 504 or a stack perimeter of the stack substrate 530. The inter-substrate connector 558 can be formed adjacent the base barrier 510 in the inter-substrate region 556.

The stack integrated circuit package 528 can be mounted over the base integrated circuit package 502 with the inter-substrate connector 558. The inter-substrate connector 558 can be attached or connected to the base integrated circuit package 502 and the stack integrated circuit package 528.

The integrated circuit packaging system 500 can include a top integrated circuit package 564 mounted over the stack integrated circuit package 528. The top integrated circuit package 564 can include a top substrate 566, such as a laminated plastic or ceramic substrate, an organic or inorganic substrate, a carrier, a printed circuit board (PCB), or a printed wiring substrate. The top substrate 566 can include bond sites, conductive layers, wiring layers, or traces, to provide electrical connectivity.

The top substrate 566 can include a top substrate bottom surface 568 and a top substrate top surface 570 on a side of the top substrate 566 opposite the top substrate bottom surface 568. The top substrate 566 can include a top substrate aperture 572 defined as a through slot or an opening. The top substrate aperture 572 can be formed through the top substrate 566, between the top substrate bottom surface 568 and the top substrate top surface 570.

The top integrated circuit package 564 can include a top integrated circuit 574, such as an integrated circuit die, a wirebond integrated circuit, or a chip, mounted over the top substrate 566. The top integrated circuit 574 can be attached to the top substrate 566 with an attach layer, such as a die attach, an adhesive, a film, or an epoxy. The top integrated circuit package 564 can include a top internal interconnect 576, such as a bond wire, a ribbon bond wire, or a conductive wire, attached or connected to the top substrate 566 and the top integrated circuit 574.

The top integrated circuit package 564 can include a top encapsulation 582, such as a cover including an epoxy molding compound, an encapsulant, or a molding material. The top encapsulation 582 can include a taper side that is slanted to facilitate a release of a mold system in a molding process of the top encapsulation 582.

The top encapsulation 582 can be formed over the top substrate 566, partially covering the top substrate top surface 570. The top encapsulation 582 can be formed over the top integrated circuit 574 and the top internal interconnect 576.

The integrated circuit packaging system 500 can include a second inter-substrate region 584 defined as spacing between the stack substrate 530 and the top substrate 566. The second inter-substrate region 584 can include spacing between the stack substrate top surface 534 and the top substrate bottom surface 568.

The second inter-substrate region 584 can include an inter-package standoff gap. The second inter-substrate region 584 can include spacing for the stack encapsulation 552 and any spacing between the stack encapsulation 552 and the top substrate bottom surface 568.

The integrated circuit packaging system 500 can include a second inter-substrate connector 586, such as a solder ball, a stud bump, a solder column, a metal conductor, or a metallic alloy conductor. The second inter-substrate connector 586 can be formed in the second inter-substrate region 584. The second inter-substrate connector 586 can be attached or connected to the stack substrate top surface 534 and the top substrate bottom surface 568.

The second inter-substrate connector 586 can be formed in an area array around or along the stack perimeter or a top perimeter of the top substrate 566. The second inter-substrate connector 586 can be formed around or adjacent the stack encapsulation 552. The second inter-substrate connector 586 can be formed adjacent the stack barrier 540.

The integrated circuit packaging system 500 can include an external interconnect 588, such as a solder ball, a stud bump, a solder column, a metal conductor, or a metallic alloy conductor, attached to the base substrate bottom surface 506. The external interconnect 588 can be formed on the base substrate bottom surface 506, providing electrical connectivity to external systems. The external interconnect 588 can be formed in a full area array.

The integrated circuit packaging system 500 can include a connector underfill 590, such as a resin, an encapsulant, an epoxy, an underfill, a liquid encapsulant, or the underfill encapsulant. The connector underfill 590 can function as a reinforcement layer in the inter-substrate region 556 and the second inter-substrate region 584, providing protection for the inter-substrate connector 558 and the second inter-substrate connector 586, respectively. The connector underfill 590 can be formed with board-level underfill processes, which can be readily performed by surface mount technology (SMT) manufacturers for pre-stacked PoP systems.

The connector underfill 590 can be filled or dispensed with a dispenser or any encapsulation method during manufacturing processes, which can include dispensing guns, cartridges, syringes, needle tips, or spreaders, as examples. The connector underfill 590 can be filled through the stack substrate aperture 536 and the top substrate aperture 572. The connector underfill 590 can encapsulate the inter-substrate connector 558, the second inter-substrate connector 586, or joints or junctions where the inter-substrate connector 558 is attached or connected to the base substrate 504 and the stack substrate 530 or where the second inter-substrate connector 586 is attached or connected to the stack substrate 530 and the top substrate 566.

The stack barrier 540 can be formed over or on the stack substrate top surface 534, adjacent or along the stack perimeter to prevent overspill. The stack barrier 540 can prevent the connector underfill 590 from flowing over edges of the stack substrate 530.

As an example, the stack barrier 540 can include a closed loop structure that is contiguously formed around the stack perimeter. As another example, the stack barrier 540 can include a segmental structure that is partially formed around the stack perimeter.

The top substrate aperture 572 can be strategically or selectively formed at a peripheral area of the top substrate 566. For example, the top substrate aperture 572 can be selectively formed at or near corners of the top substrate 566 to encapsulate the second inter-substrate connector 586 that are critical. The connector underfill 590 can be filled through the stack substrate aperture 536 and the top substrate aperture 572 with top side dispensing methods.

Figure 6:
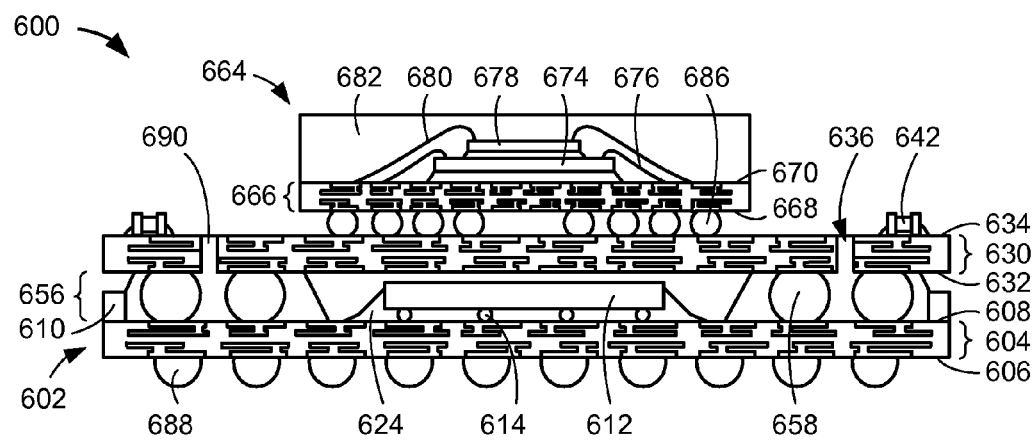
FIG. 6 is a cross-sectional view of an integrated circuit packaging system along a section line 6-6 of FIG. 7 in a fourth embodiment of the present invention.
Figure 7:
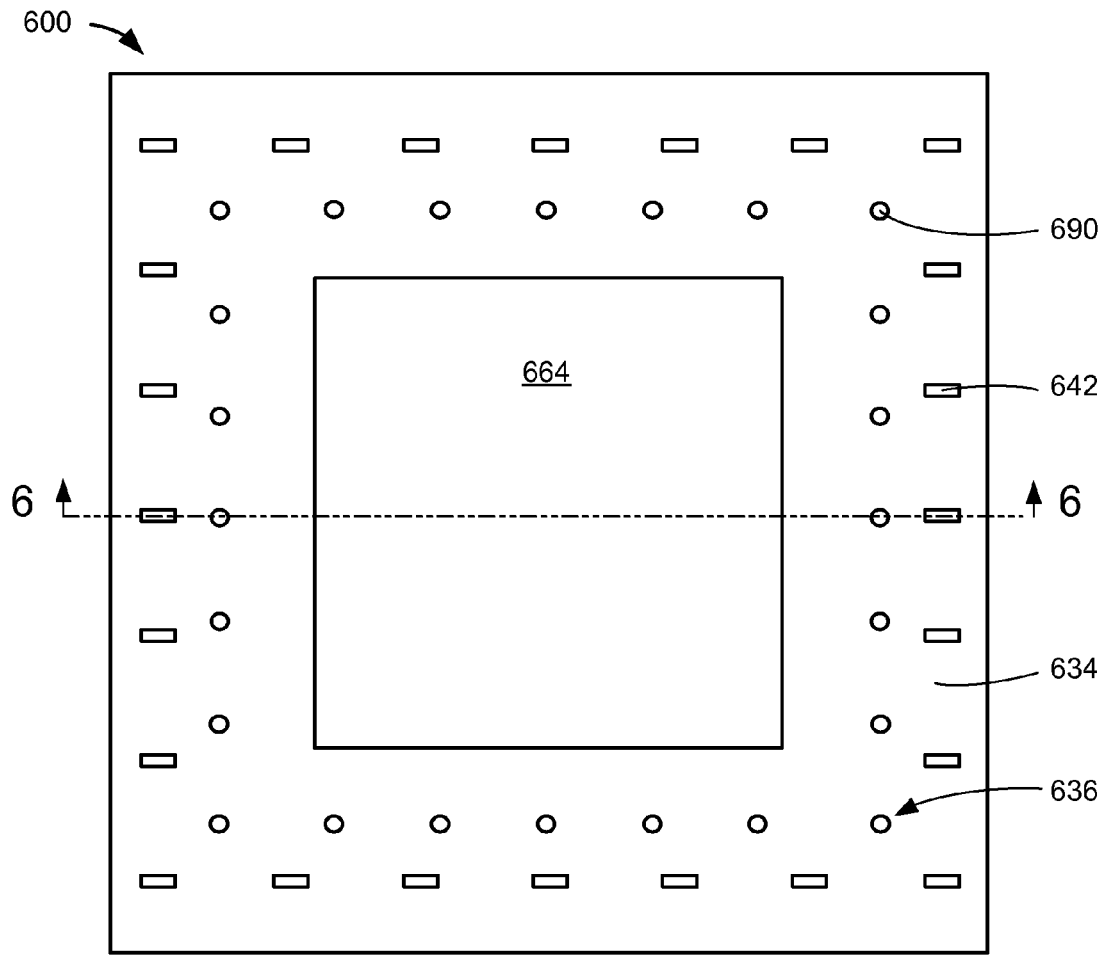
FIG. 7 is a top view of the integrated circuit packaging system.

Referring now to FIG. 6, therein is shown a cross-sectional view of an integrated circuit packaging system 600 along a section line 6-6 of FIG. 7 in a fourth embodiment of the present invention. The integrated circuit packaging system 600 can represent a configuration of a packaging system, which can include a pre-stacked package-on-package (PoP) structure with an underfill encapsulant formed under an interposer by top side dispensing methods.

The integrated circuit packaging system 600 can include a base integrated circuit package 602. The base integrated circuit package 602 can include a base substrate 604, having a base substrate bottom surface 606 and a base substrate top surface 608, and a base barrier 610. The base substrate 604 and the base barrier 610 can be formed in a manner similar to the base substrate 104 of FIG. 1 and the base barrier 110 of FIG. 1, respectively.

The base integrated circuit package 602 can provide the base substrate 604 to mount a base integrated circuit 612, such as a flip chip, a die, or a bumped chip, thereon. The base integrated circuit 612 can be attached or connected to the base substrate top surface 608 with a base internal interconnect 614, such as a solder ball, a stud bump, a solder column, a metal conductor, or a metallic alloy conductor. The base integrated circuit package 602 can include a base underfill 624, such as an epoxy resin or any underfill resin material, dispensed in the space between the base substrate top surface 608 and the base integrated circuit 612 to protect the base internal interconnect 614.

The integrated circuit packaging system 600 can include a stack substrate 630, such as an interposer, a substrate, an internal stacking module, an interface module, or a PCB. The stack substrate 630 can be mounted over the base integrated circuit package 602.

The stack substrate 630 can include a stack substrate bottom surface 632 and a stack substrate top surface 634 on a side of the stack substrate 630 opposite the stack substrate bottom surface 632. The stack substrate 630 can be designed in a singulated or strip form for encapsulant dispensing. The stack substrate 630 can include bond sites, conductive layers, wiring layers, or traces, to provide electrical connectivity between electrical devices or packaging systems that are connected to the stack substrate bottom surface 632 and the stack substrate top surface 634.

The stack substrate 630 can include a stack substrate aperture 636 defined as a through slot or an opening. The stack substrate aperture 636 can be formed through the stack substrate 630, between the stack substrate bottom surface 632 and the stack substrate top surface 634.

The integrated circuit packaging system 600 can optionally include a stack device 642, such as a passive device, an active device, or a discrete component, mounted over the stack substrate 630. The stack device 642 can be mounted around or along a stack perimeter of the stack substrate 630.

For illustrative purposes, the cross-sectional view is shown with the stack device 642 mounted on or attached to the stack substrate top surface 634, although the stack device 642 can be mounted on or attached to the stack substrate bottom surface 632, the stack substrate top surface 634, or a combination thereof.

The integrated circuit packaging system 600 can include an inter-substrate region 656 defined as an inter-package stand-off gap or spacing between the base substrate 604 and the stack substrate 630. The inter-substrate region 656 can include spacing between the base substrate top surface 608 and the stack substrate bottom surface 632. The inter-substrate region 656 can include spacing for the base integrated circuit 612, the base internal interconnect 614, and any spacing between the base integrated circuit 612 and the stack substrate bottom surface 632.

The integrated circuit packaging system 600 can include an inter-substrate connector 658, such as a solder ball, a stud bump, a solder column, a metal conductor, or a metallic alloy conductor. The inter-substrate connector 658 can be attached or connected to the base substrate top surface 608 and the stack substrate bottom surface 632.

The inter-substrate connector 658 can be formed in an area array around or along a base perimeter of the base substrate 604 or the stack perimeter. The inter-substrate connector 658 can be formed adjacent the base barrier 610.

The stack substrate 630 can be mounted over the base integrated circuit package 602 with the inter-substrate connector 658. The inter-substrate connector 658 can be attached or connected to the base integrated circuit package 602 and the stack substrate 630 in the inter-substrate region 656.

The integrated circuit packaging system 600 can include a top integrated circuit package 664 mounted over the stack substrate 630. The top integrated circuit package 664 can include a top substrate 666, such as a laminated plastic or ceramic substrate, an organic or inorganic substrate, a carrier, a printed circuit board (PCB), or a printed wiring substrate.

The top substrate 666 can include bond sites, conductive layers, wiring layers, or traces, to provide electrical connectivity. The top substrate 666 can include a top substrate bottom surface 668 and a top substrate top surface 670 on a side of the top substrate 666 opposite the top substrate bottom surface 668.

The top integrated circuit package 664 can include a top integrated circuit 674, such as an integrated circuit die, a wirebond integrated circuit, or a chip, mounted over the top substrate 666. The top integrated circuit 674 can be attached to the top substrate 666 with an attach layer, such as a die attach, an adhesive, a film, or an epoxy. The top integrated circuit package 664 can include a top internal interconnect 676, such as a bond wire, a ribbon bond wire, or a conductive wire, attached or connected to the top substrate 666 and the top integrated circuit 674.

The top integrated circuit package 664 can include a top second integrated circuit 678, such as an integrated circuit die, a wirebond integrated circuit, or a chip, mounted over the top integrated circuit 674. The top second integrated circuit 678 can be attached to the top integrated circuit 674 with an attach layer, such as a die attach, an adhesive, a film, or an epoxy. The top integrated circuit package 664 can include a top second internal interconnect 680, such as a bond wire, a ribbon bond wire, or a conductive wire, attached or connected to the top substrate 666 and the top second integrated circuit 678.

The top integrated circuit package 664 can include a top encapsulation 682, such as a cover including an epoxy molding compound, an encapsulant, or a molding material. The top encapsulation 682 can be formed over the top substrate 666, the top integrated circuit 674, the top internal interconnect 676, the top second integrated circuit 678, or the top second internal interconnect 680.

The integrated circuit packaging system 600 can include a second inter-substrate connector 686, such as a solder ball, a stud bump, a solder column, a metal conductor, or a metallic alloy conductor. The second inter-substrate connector 686 can be attached or connected to the stack substrate top surface 634 and the top substrate bottom surface 668. The second inter-substrate connector 686 can be attached to a center region of the stack substrate top surface 634.

The integrated circuit packaging system 600 can include an external interconnect 688, such as a solder ball, a stud bump, a solder column, a metal conductor, or a metallic alloy conductor, attached to the base substrate bottom surface 606. The external interconnect 688 can be formed on the base substrate bottom surface 606, providing electrical connectivity to external systems. The external interconnect 688 can be formed in a full area array.

The integrated circuit packaging system 600 can include a connector underfill 690, such as a resin, an encapsulant, an epoxy, an underfill, a liquid encapsulant, or the underfill encapsulant. The connector underfill 690 can function as a reinforcement layer in the inter-substrate region 656, providing protection for the inter-substrate connector 658.

The connector underfill 690 can be filled or dispensed with a dispenser or any encapsulation method during manufacturing processes, which can include dispensing guns, cartridges, syringes, needle tips, or spreaders, as examples. The connector underfill 690 can be dispensed or filled through the stack substrate aperture 636. The connector underfill 690 can encapsulate the inter-substrate connector 658 or joints where the inter-substrate connector 658 is attached or connected to the base substrate 604 and the stack substrate 630.

With the stack substrate 630, the integrated circuit packaging system 600 can include the top integrated circuit package 664 having a smaller footprint mounted over the base integrated circuit package 602 having a larger footprint. The top integrated circuit package 664 can have a configuration with a width smaller than that of the stack substrate 630.

This configuration can allow the entirety of the top integrated circuit package 664 mounted over a portion of the stack substrate 630 that is adjacent or next to another portion of the stack substrate 630 that includes the stack substrate aperture 636. Such configuration can allow the dispenser or any encapsulation method to dispense the connector underfill 690 beside or next to a vertical surface of the top integrated circuit package 664.

Referring now to FIG. 7, therein is shown a top view of the integrated circuit packaging system 600. The integrated circuit packaging system 600 can include the stack substrate 630 of FIG. 6 having the stack substrate top surface 634 and the stack substrate aperture 636 formed thereon. The stack substrate aperture 636 can be formed around or along the stack perimeter.

The stack substrate aperture 636 can be formed adjacent the stack device 642 or the top integrated circuit package 664. The stack substrate aperture 636 can be formed between the stack device 642 and the top integrated circuit package 664. The connector underfill 690 can be dispensed through the stack substrate aperture 636.

The stack device 642 can be formed around or along the stack perimeter. The top integrated circuit package 664 can be mounted over the stack substrate 630.

Figure 8:
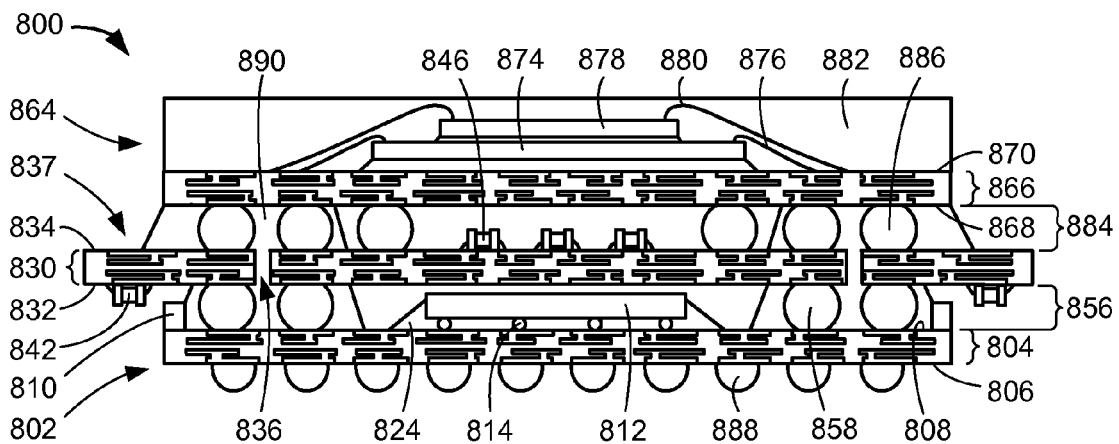
FIG. 8 is a cross-sectional view of an integrated circuit packaging system along a section line 8-8 of FIG. 9 in a fifth embodiment of the present invention.
Figure 9:
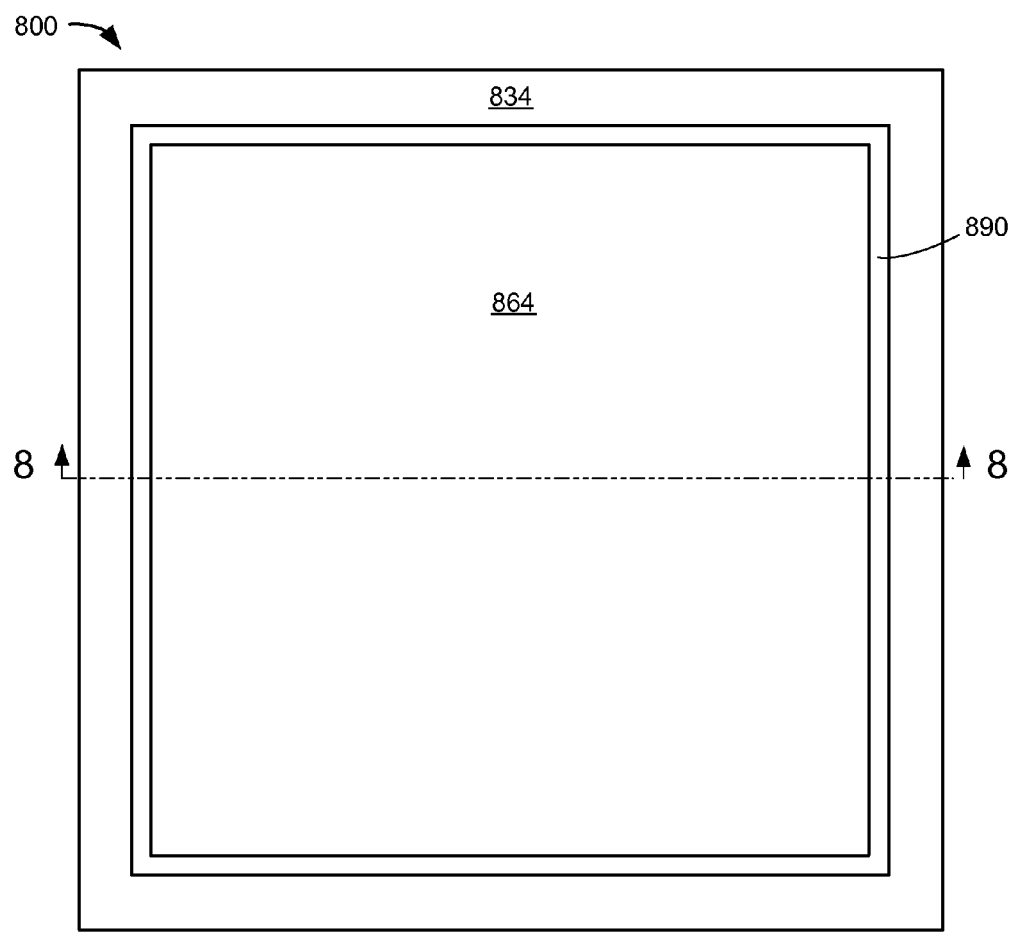
FIG. 9 is a top view of the integrated circuit packaging system.

Referring now to FIG. 8, therein is shown a cross-sectional view of an integrated circuit packaging system 800 along a section line 8-8 of FIG. 9 in a fifth embodiment of the present invention. The integrated circuit packaging system 800 can represent a configuration of a packaging system, which can include a pre-stacked package-on-package (PoP) structure with an underfill encapsulant formed by top side dispensing methods on a protruded interposer.

The integrated circuit packaging system 800 can be similar to the integrated circuit packaging system 600 of FIG. 6, except for the formation of the stack substrate 630 of FIG. 6, the stack device 642 of FIG. 6, and the top integrated circuit package 664 of FIG. 6, and an addition of another stack device. The integrated circuit packaging system 800 can include a base integrated circuit package 802.

The base integrated circuit package 802 can include a base substrate 804, having a base substrate bottom surface 806 and a base substrate top surface 808, and a base barrier 810. The base substrate 804 and the base barrier 810 can be formed in a manner similar to the base substrate 604 of FIG. 6 and the base barrier 610 of FIG. 6, respectively.

The base integrated circuit package 802 can include a base integrated circuit 812, a base internal interconnect 814, and a base underfill 824. The base integrated circuit 812, the base internal interconnect 814, and the base underfill 824 can be formed in a manner similar to the base integrated circuit 612 of FIG. 6, the base internal interconnect 614 of FIG. 6, and the base underfill 624 of FIG. 6, respectively.

The integrated circuit packaging system 800 can include a stack substrate 830, such as an interposer, a substrate, an internal stacking module, an interface module, or a PCB. The stack substrate 830 can be mounted over the base integrated circuit package 802.

The stack substrate 830 can include a stack substrate bottom surface 832 and a stack substrate top surface 834 on a side of the stack substrate 830 opposite the stack substrate bottom surface 832. The stack substrate 830 can be designed in a singulated or strip form for encapsulant dispensing.

The stack substrate 830 can include bond sites, conductive layers, wiring layers, or traces, to provide electrical connectivity between electrical devices or packaging systems that are connected to the stack substrate bottom surface 832 and the stack substrate top surface 834.

The stack substrate 830 can include a stack substrate aperture 836 defined as a through slot or an opening. The stack substrate aperture 836 can be formed through the stack substrate 830, between the stack substrate bottom surface 832 and the stack substrate top surface 834.

The stack substrate 830 can include a stack substrate protrusion 837. The stack substrate protrusion 837 can outwardly laterally extend from the center of the stack substrate 830. The stack substrate protrusion 837 can overhang or project over the base integrated circuit package 802. In other words, edges of the stack substrate 830 can laterally extend beyond edges of the base integrated circuit package 802 or the base substrate 804.

The integrated circuit packaging system 800 can optionally include a stack device 842, such as a passive device, an active device, or a discrete component, mounted under the stack substrate 830. The stack device 842 can be mounted over or attached to the stack substrate bottom surface 832. The stack device 842 can be mounted around or along a stack perimeter of the stack substrate 830.

The integrated circuit packaging system 800 can optionally include a stack second device 846, such as a passive device, an active device, or a discrete component, mounted over the stack substrate 830. The stack second device 846 can be mounted over or attached to the stack substrate top surface 834. The stack device 842 can be mounted over a center region of the stack substrate 830.

The integrated circuit packaging system 800 can include an inter-substrate region 856 and an inter-substrate connector 858. The inter-substrate region 856 and the inter-substrate connector 858 can be formed in a manner similar to the inter-substrate region 656 of FIG. 6 and the inter-substrate connector 658 of FIG. 6, respectively.

The integrated circuit packaging system 800 can include a top integrated circuit package 864. The top integrated circuit package 864 can include a top substrate 866, having a top substrate bottom surface 868 and a top substrate top surface 870, a top integrated circuit 874, a top internal interconnect 876, a top second integrated circuit 878, a top second internal interconnect 880, and a top encapsulation 882.

The top substrate 866, the top integrated circuit 874, the top internal interconnect 876, the top second integrated circuit 878, the top second internal interconnect 880, and the top encapsulation 882 can be formed in a manner similar to the top substrate 666 of FIG. 6, the top integrated circuit 674 of FIG. 6, the top internal interconnect 676 of FIG. 6, the top second integrated circuit 678 of FIG. 6, the top second internal interconnect 680 of FIG. 6, and the top encapsulation 682 of FIG. 6, respectively.

The integrated circuit packaging system 800 can include a second inter-substrate region 884 defined as spacing between the stack substrate 830 and the top substrate 866. The second inter-substrate region 884 can include spacing between the stack substrate top surface 834 and the top substrate bottom surface 868. The second inter-substrate region 884 can include an inter-package standoff gap.

The integrated circuit packaging system 800 can include a second inter-substrate connector 886, such as a solder ball, a stud bump, a solder column, a metal conductor, or a metallic alloy conductor. The second inter-substrate connector 886 can be attached or connected to the top substrate bottom surface 868 and the stack substrate top surface 834. The second inter-substrate connector 886 can be formed in an area array around or near the stack perimeter.

The integrated circuit packaging system 800 can include an external interconnect 888. The external interconnect 888 can be formed in a manner similar to the external interconnect 688 of FIG. 6.

The integrated circuit packaging system 800 can include a connector underfill 890, such as a resin, an encapsulant, an epoxy, an underfill, a liquid encapsulant, or the underfill encapsulant. The connector underfill 890 can function as a reinforcement layer in the inter-substrate region 856 and the second inter-substrate region 884, providing protection for the inter-substrate connector 858 and the second inter-substrate connector 886, respectively.

The connector underfill 890 can be dispensed over or on a portion of the stack substrate protrusion 837, encapsulating the second inter-substrate connector 886 in the second inter-substrate region 884. The connector underfill 890 can be dispensed over or on a portion of the stack substrate top surface 834 and filled through the stack substrate aperture 836, encapsulating the inter-substrate connector 858 in the inter-substrate region 856. The connector underfill 890 can be filled to encapsulate joints or junctions where the inter-substrate connector 858 is attached or connected to the base substrate 804 and the stack substrate 830 or where the second inter-substrate connector 886 is attached or connected to the stack substrate 830 and the top substrate 866.

For illustrative purposes, the cross-sectional view is shown with numbers of the inter-substrate connector 858 and the second inter-substrate connector 886 encapsulated with the connector underfill 890 as two and two, respectively, on each side of the stack substrate 830, although any numbers of the inter-substrate connector 858 and the second inter-substrate connector 886 can be encapsulated with the connector underfill 890.

The stack device 842 can be attached to the stack substrate protrusion 837 or over the stack substrate bottom surface 832. The stack second device 846 can be attached to the stack substrate top surface 834 or between a plurality of the second inter-substrate connector 886.

Referring now to FIG. 9, therein is shown a top view of the integrated circuit packaging system 800. The integrated circuit packaging system 800 can include the top integrated circuit package 864 mounted over the stack substrate top surface 834. The integrated circuit packaging system 800 can include a portion of the connector underfill 890 dispensed over the stack substrate top surface 834.

Figure 10:
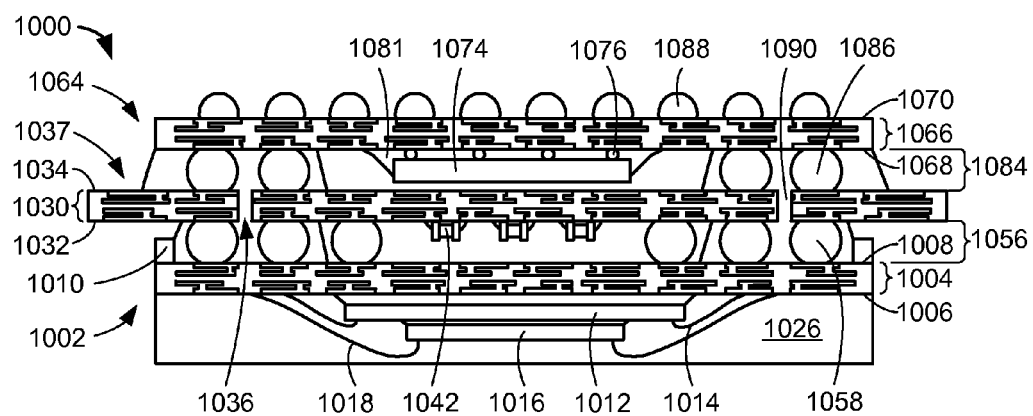
FIG. 10 is a cross-sectional view of an integrated circuit packaging system along a section line 10-10 of FIG. 11 in a sixth embodiment of the present invention.
Figure 11:
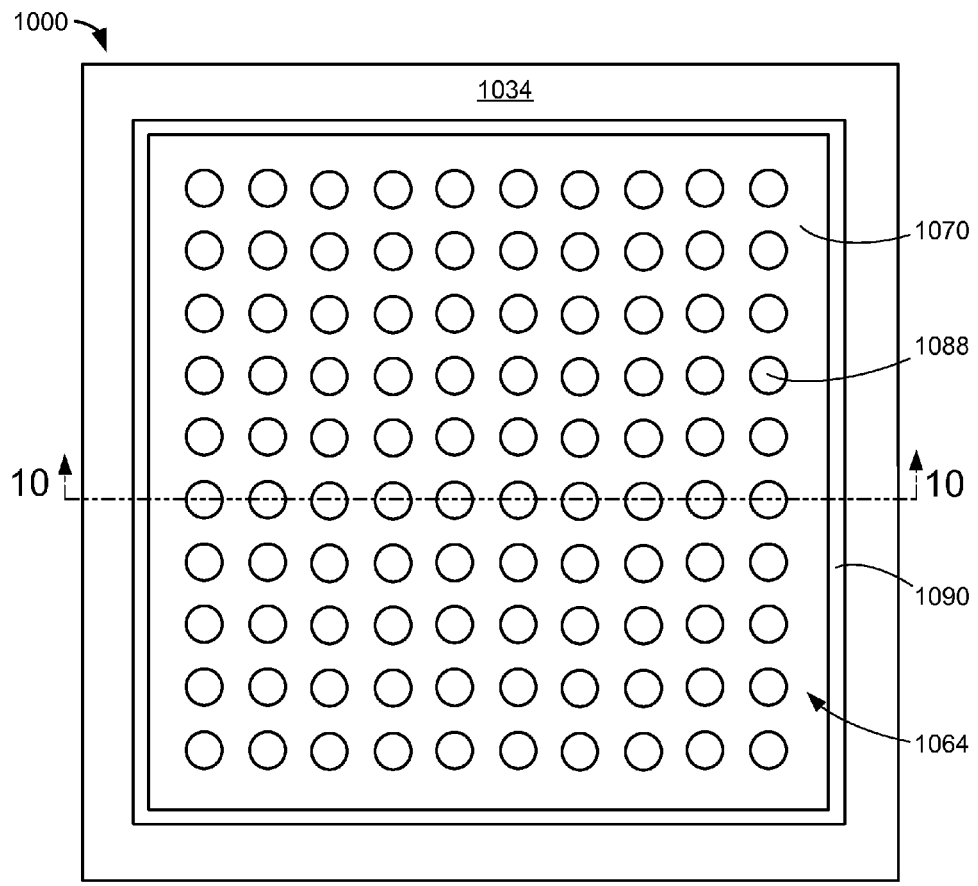
FIG. 11 is a top view of the integrated circuit packaging system.

Referring now to FIG. 10, therein is shown a cross-sectional view of an integrated circuit packaging system 1000 along a section line 10-10 of FIG. 11 in a sixth embodiment of the present invention. The integrated circuit packaging system 1000 can represent a configuration of a packaging system, which can include a pre-stacked package-on-package (PoP) structure with an underfill encapsulant formed by bottom side dispensing methods on a protruded interposer.

The integrated circuit packaging system 1000 can represent a configuration of a packaging system that is similar to the integrated circuit packaging system 800 of FIG. 8 and is inverted to allow the underfill encapsulant to be dispensed from the bottom side of the protruded interposer. The integrated circuit packaging system 1000 can include a base integrated circuit package 1002.

The base integrated circuit package 1002 can include a base substrate 1004, such as a laminated plastic or ceramic substrate, an organic or inorganic substrate, a carrier, a printed circuit board (PCB), or a printed wiring substrate. The base substrate 1004 can include bond sites, conductive layers, wiring layers, or traces, to provide electrical connectivity.

The base substrate 1004 can include a base substrate bottom surface 1006 and a base substrate top surface 1008 on a side of the base substrate 1004 opposite the base substrate bottom surface 1006. The base integrated circuit package 1002 can include a base barrier 1010 defined as a dam or a structure formed to contain or prevent the underfill encapsulation from overflowing over sides of the base substrate 1004.

The base barrier 1010 can be formed with an epoxy resin, a photoresist, or a solder mask. The base barrier 1010 can be mounted over or attached to the base substrate top surface 1008. The base barrier 1010 can be formed along or around a base perimeter of the base substrate 1004.

The base integrated circuit package 1002 can include a base integrated circuit 1012, such as an integrated circuit die, a wirebond integrated circuit, or a chip, mounted over the base substrate 1004. The base integrated circuit 1012 can be attached to the base substrate bottom surface 1006 with an attach layer, such as a die attach, an adhesive, a film, or an epoxy. The base integrated circuit package 1002 can include a base internal interconnect 1014, such as a bond wire, a ribbon bond wire, or a conductive wire, attached or connected to the base substrate bottom surface 1006 and the base integrated circuit 1012.

The base integrated circuit package 1002 can include a base second integrated circuit 1016, such as an integrated circuit die, a wirebond integrated circuit, or a chip, mounted over the base integrated circuit 1012. The base second integrated circuit 1016 can be attached to the base integrated circuit 1012 with an attach layer, such as a die attach, an adhesive, a film, or an epoxy. The base integrated circuit package 1002 can include a base second internal interconnect 1018, such as a bond wire, a ribbon bond wire, or a conductive wire, attached or connected to the base substrate bottom surface 1006 and the base second integrated circuit 1016.

The base integrated circuit package 1002 can include a base encapsulation 1026, such as a cover including an epoxy molding compound, an encapsulant, or a molding material. The base encapsulation 1026 can be formed over the base substrate 1004, the base integrated circuit 1012, the base internal interconnect 1014, the base second integrated circuit 1016, and the base second internal interconnect 1018.

The integrated circuit packaging system 1000 can include a stack substrate 1030, such as an interposer, a substrate, an internal stacking module, an interface module, or a PCB. The stack substrate 1030 can be mounted over the base integrated circuit package 1002.

The stack substrate 1030 can include a stack substrate bottom surface 1032 and a stack substrate top surface 1034 on a side of the stack substrate 1030 opposite the stack substrate bottom surface 1032. The stack substrate 1030 can be designed in a singulated or strip form for encapsulant dispensing.

The stack substrate 1030 can include bond sites, conductive layers, wiring layers, or traces, to provide electrical connectivity between electrical devices or packaging systems that are connected to the stack substrate bottom surface 1032 and the stack substrate top surface 1034.

The stack substrate 1030 can include a stack substrate aperture 1036 defined as a through slot or an opening. The stack substrate aperture 1036 can be formed through the stack substrate 1030, between the stack substrate bottom surface 1032 and the stack substrate top surface 1034.

The stack substrate 1030 can include a stack substrate protrusion 1037. The stack substrate protrusion 1037 can outwardly laterally extend from the center of the stack substrate 1030. The stack substrate protrusion 1037 can overhang or project over the base integrated circuit package 1002. In other words, edges of the stack substrate 1030 can laterally extend beyond edges of the base integrated circuit package 1002 or the base substrate 1004.

The integrated circuit packaging system 1000 can include a stack device 1042, such as a passive device, an active device, or a discrete component, mounted under the stack substrate 1030. The stack device 1042 can be mounted over or attached to the stack substrate bottom surface 1032. The stack device 1042 can be mounted over, under, or near a center region of the stack substrate 1030.

The integrated circuit packaging system 1000 can include an inter-substrate region 1056 defined as spacing between the base substrate 1004 and the stack substrate 1030. The inter-substrate region 1056 can include spacing between the base substrate top surface 1008 and the stack substrate bottom surface 1032.

The integrated circuit packaging system 1000 can include an inter-substrate connector 1058, such as a solder ball, a stud bump, a solder column, a metal conductor, or a metallic alloy conductor. The inter-substrate connector 1058 can be formed in the inter-substrate region 1056. The inter-substrate connector 1058 can be attached or connected to the base substrate top surface 1008 and the stack substrate bottom surface 1032.

The inter-substrate connector 1058 can be formed in an area array around or along the base perimeter or a stack perimeter of the stack substrate 1030. The inter-substrate connector 1058 can be formed adjacent the base barrier 1010.

The integrated circuit packaging system 1000 can include a top integrated circuit package 1064. The top integrated circuit package 1064 can include a top substrate 1066, such as a laminated plastic or ceramic substrate, an organic or inorganic substrate, a carrier, a printed circuit board (PCB), or a printed wiring substrate.

The top substrate 1066 can include bond sites, conductive layers, wiring layers, or traces, to provide electrical connectivity. The top substrate 1066 can include a top substrate bottom surface 1068 and a top substrate top surface 1070 on a side of the top substrate 1066 opposite the top substrate bottom surface 1068.

The top integrated circuit package 1064 can include a top integrated circuit 1074, such as a flip chip, a die, or a bumped chip, mounted under the top substrate 1066 or over the top substrate bottom surface 1068. The top integrated circuit 1074 can be attached or connected to the top substrate bottom surface 1068 with a top internal interconnect 1076, such as a solder ball, a stud bump, a solder column, a metal conductor, or a metallic alloy conductor. The top integrated circuit package 1064 can include a top underfill 1081, such as an epoxy resin or any underfill resin material, dispensed in the space between the top substrate bottom surface 1068 and the top integrated circuit 1074 to protect the top internal interconnect 1076.

The integrated circuit packaging system 1000 can include a second inter-substrate region 1084 defined as spacing between the stack substrate 1030 and the top substrate 1066. The second inter-substrate region 1084 can include spacing between the stack substrate top surface 1034 and the top substrate bottom surface 1068.

The integrated circuit packaging system 1000 can include a second inter-substrate connector 1086, such as a solder ball, a stud bump, a solder column, a metal conductor, or a metallic alloy conductor. The second inter-substrate connector 1086 can be attached or connected to the stack substrate top surface 1034 and the top substrate bottom surface 1068. The second inter-substrate connector 1086 can be formed in an area array around or near the stack perimeter.

The integrated circuit packaging system 1000 can include an external interconnect 1088, such as a solder ball, a stud bump, a solder column, a metal conductor, or a metallic alloy conductor, attached to the top substrate top surface 1070. The external interconnect 1088 can be formed to provide electrical connectivity to external systems.

The integrated circuit packaging system 1000 can include a connector underfill 1090, such as a resin, an encapsulant, an epoxy, an underfill, a liquid encapsulant, or the underfill encapsulant. The connector underfill 1090 can function as a reinforcement layer in the inter-substrate region 1056 and the second inter-substrate region 1084, providing protection for the inter-substrate connector 1058 and the second inter-substrate connector 1086, respectively.

The connector underfill 1090 can be dispensed over or on a portion of the stack substrate protrusion 1037, encapsulating the second inter-substrate connector 1086 in the second inter-substrate region 1084. The connector underfill 1090 can be dispensed over or on a portion of the stack substrate top surface 1034 and filled through the stack substrate aperture 1036, encapsulating the inter-substrate connector 1058 in the inter-substrate region 1056. The connector underfill 1090 can be filled to encapsulate joints or junctions where the inter-substrate connector 1058 is attached or connected to the base substrate 1004 and the stack substrate 1030 or where the second inter-substrate connector 1086 is attached or connected to the stack substrate 1030 and the top substrate 1066.

For illustrative purposes, the cross-sectional view is shown with numbers of the inter-substrate connector 1058 and the second inter-substrate connector 1086 encapsulated with the connector underfill 1090 as two and two, respectively, on each side of the stack substrate 1030, although any numbers of the inter-substrate connector 1058 and the second inter-substrate connector 1086 can be encapsulated with the connector underfill 1090.

The stack device 1042 can be attached to the stack substrate bottom surface 1032. The stack device 1042 can be attached to the stack substrate 1030 between a plurality of the inter-substrate connector 1058.

Referring now to FIG. 11, therein is shown a top view of the integrated circuit packaging system 1000. The integrated circuit packaging system 1000 can include the top integrated circuit package 1064 mounted over the stack substrate top surface 1034.

The integrated circuit packaging system 1000 can include the external interconnect 1088 attached to the top substrate top surface 1070. The integrated circuit packaging system 1000 can include a portion of the connector underfill 1090 dispensed over the stack substrate top surface 1034.

Figure 12:
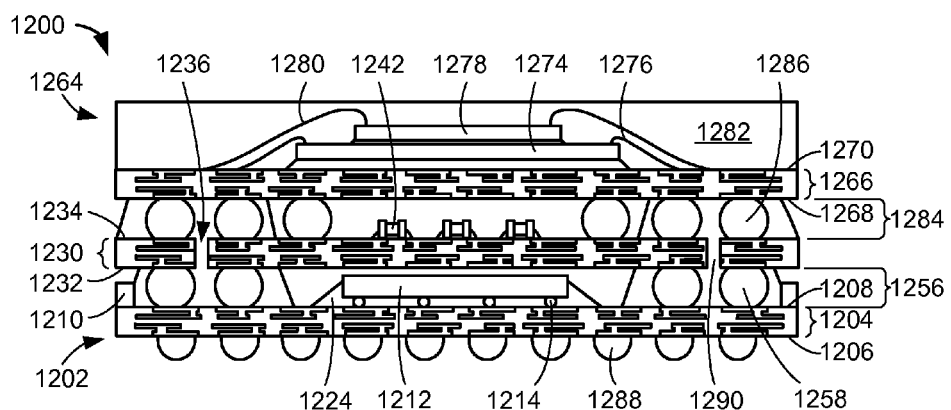
FIG. 12 is a cross-sectional view of an integrated circuit packaging system along a section line 12-12 of FIG. 13 in a seventh embodiment of the present invention.
Figure 13:
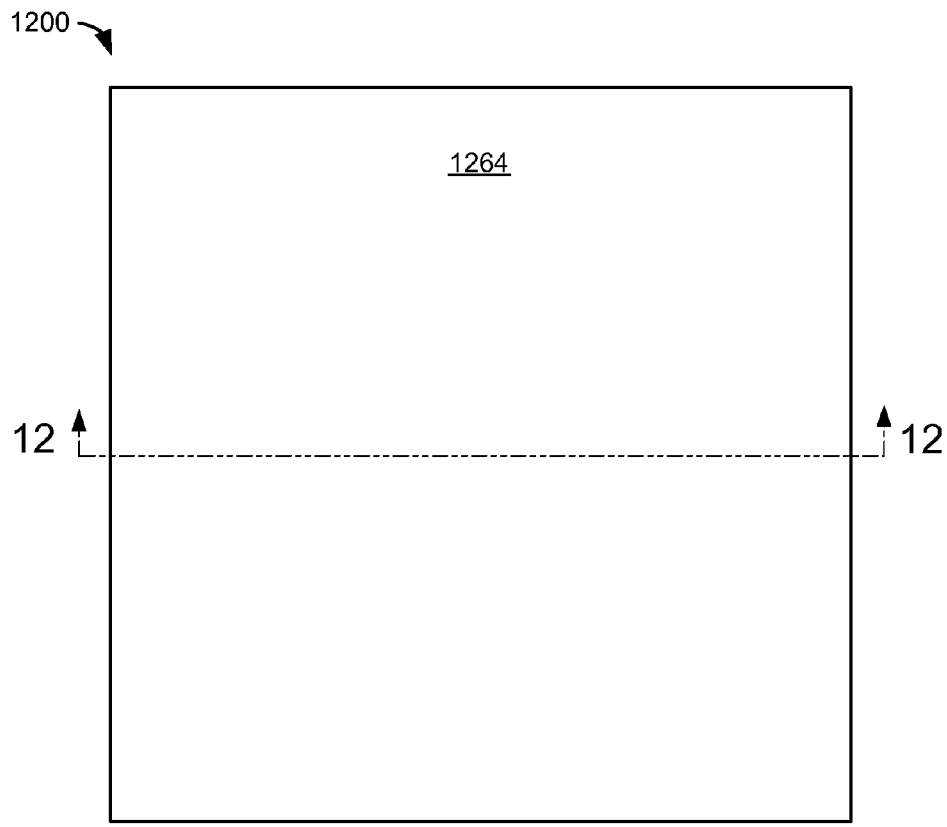
FIG. 13 is a top view of the integrated circuit packaging system.

Referring now to FIG. 12, therein is shown a cross-sectional view of an integrated circuit packaging system 1200 along a section line 12-12 of FIG. 13 in a seventh embodiment of the present invention. The integrated circuit packaging system 1200 can represent a configuration of a packaging system, which can include a pre-stacked package-on-package (PoP) structure with an underfill encapsulant formed by top side dispensing methods on a protruded interposer, after trimming off the excessive edges of the protruded interposer.

The integrated circuit packaging system 1200 can be similar to the integrated circuit packaging system 800 of FIG. 8, except for the formation of the stack substrate 830 of FIG. 8. The integrated circuit packaging system 1200 can include a base integrated circuit package 1202.

The base integrated circuit package 1202 can include a base substrate 1204, having a base substrate bottom surface 1206 and a base substrate top surface 1208, a base barrier 1210, a base integrated circuit 1212, a base internal interconnect 1214, and a base underfill 1224. The base substrate 1204, the base barrier 1210, the base integrated circuit 1212, the base internal interconnect 1214, and the base underfill 1224 can be formed in a manner similar to the base substrate 804 of FIG. 8, the base barrier 810 of FIG. 8, the base integrated circuit 812 of FIG. 8, the base internal interconnect 814 of FIG. 8, and the base underfill 824 of FIG. 8, respectively.

The integrated circuit packaging system 1200 can include a stack substrate 1230, such as an interposer, a substrate, an internal stacking module, an interface module, or a PCB. The stack substrate 1230 can be mounted over the base integrated circuit package 1202.

The stack substrate 1230 can include a stack substrate bottom surface 1232 and a stack substrate top surface 1234 on a side of the stack substrate 1230 opposite the stack substrate bottom surface 1232. The stack substrate 1230 can be designed in a singulated or strip form for encapsulant dispensing.

The stack substrate 1230 can include bond sites, conductive layers, wiring layers, or traces, to provide electrical connectivity between electrical devices or packaging systems that are connected to the stack substrate bottom surface 1232 and the stack substrate top surface 1234.

The stack substrate 1230 can include a stack substrate aperture 1236 defined as a through slot or an opening. The stack substrate aperture 1236 can be formed through the stack substrate 1230, between the stack substrate bottom surface 1232 and the stack substrate top surface 1234. The integrated circuit packaging system 1200 can optionally include a stack device 1242 that can be formed in a manner similar to the stack second device 846 of FIG. 8.

The integrated circuit packaging system 1200 can include an inter-substrate region 1256 and an inter-substrate connector 1258. The inter-substrate region 1256 and the inter-substrate connector 1258 can be formed in a manner similar to the inter-substrate region 856 of FIG. 8 and the inter-substrate connector 858 of FIG. 8, respectively.

The integrated circuit packaging system 1200 can include a top integrated circuit package 1264. The top integrated circuit package 1264 can include a top substrate 1266, having a top substrate bottom surface 1268 and a top substrate top surface 1270, a top integrated circuit 1274, a top internal interconnect 1276, a top second integrated circuit 1278, a top second internal interconnect 1280, and a top encapsulation 1282.

The top substrate 1266, the top integrated circuit 1274, the top internal interconnect 1276, the top second integrated circuit 1278, the top second internal interconnect 1280, and the top encapsulation 1282 can be formed in a manner similar to the top substrate 866 of FIG. 8, the top integrated circuit 874 of FIG. 8, the top internal interconnect 876 of FIG. 8, the top second integrated circuit 878 of FIG. 8, the top second internal interconnect 880 of FIG. 8, and the top encapsulation 882 of FIG. 8, respectively.

The integrated circuit packaging system 1200 can include a second inter-substrate region 1284, a second inter-substrate connector 1286, an external interconnect 1288, and a connector underfill 1290. The second inter-substrate region 1284, the second inter-substrate connector 1286, the external interconnect 1288, and the connector underfill 1290 can be formed in a manner similar to the second inter-substrate region 884 of FIG. 8, the second inter-substrate connector 886 of FIG. 8, the external interconnect 888 of FIG. 8, and the connector underfill 890 of FIG. 8, respectively.

After the encapsulation process of the connector underfill 1290 is completed, a portion of the stack substrate 1230 or a portion of the connector underfill 1290 can be trimmed off or removed to maintain the overall footprint of the structure of the integrated circuit packaging system 1200. As such, widths of the base integrated circuit package 1202, the stack substrate 1230, and the top integrated circuit package 1264 can be substantially the same. The integrated circuit packaging system 1200 can have a straight profile in structure.

After the portion of the stack substrate 1230 is trimmed off or removed, the stack substrate 1230 can include an external surface having characteristics of the portion of the stack substrate 1230 removed. The characteristics of the portion of the stack substrate 1230 removed can include grinding marks, sanding marks, sawing marks, other removal tool marks, or a physically processed surface. For example, the portion of the stack substrate 1230 to be removed can include an excessive edge or a protruded portion of the stack substrate 1230.

After the portion of the connector underfill 1290 is trimmed off or removed, the connector underfill 1290 can include an external surface having characteristics of the connector underfill 1290 removed. The characteristics of the connector underfill 1290 removed can include grinding marks, sanding marks, sawing marks, other removal tool marks, or a physically processed surface. With the portion of the stack substrate 1230 and the portion of the connector underfill 1290 removed, an outer edge of the stack substrate 1230 can be substantially intersected by an extent of the connector underfill 1290.

Referring now to FIG. 13, therein is shown a top view of the integrated circuit packaging system 1200. The top view is shown with the integrated circuit packaging system 1200 having the top integrated circuit package 1264.

Figure 14:
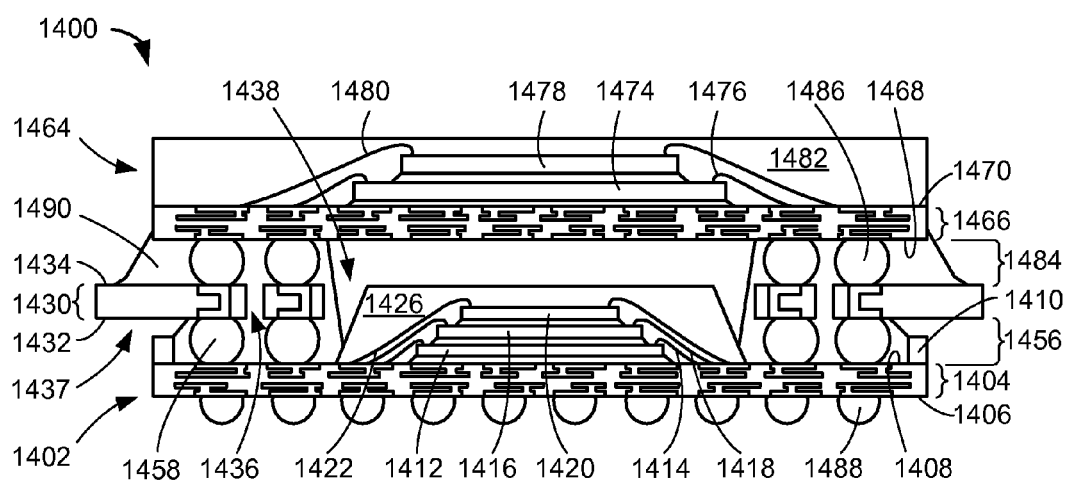
FIG. 14 is a cross-sectional view of an integrated circuit packaging system along a section line 14-14 of FIG. 15 in an eighth embodiment of the present invention.
Figure 15:
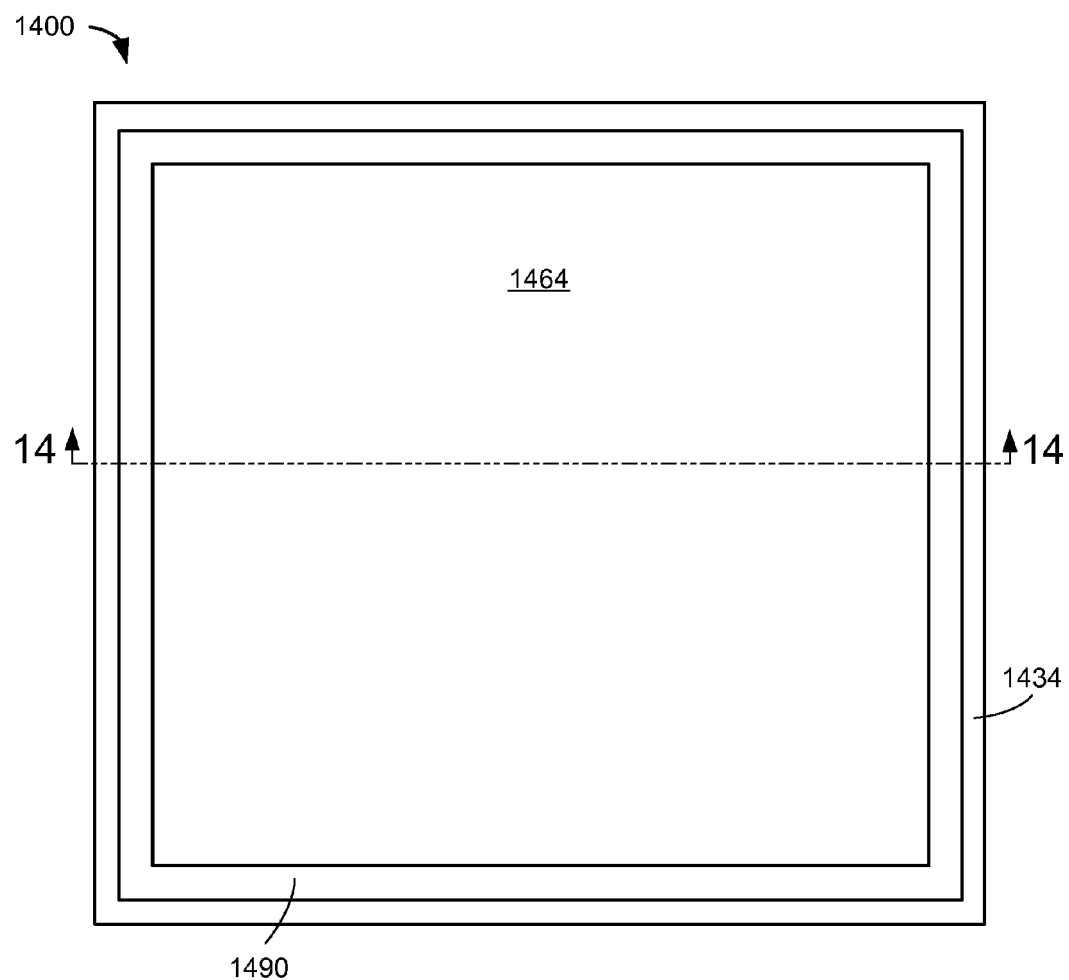
FIG. 15 is a top view of the integrated circuit packaging system.

Referring now to FIG. 14, therein is shown a cross-sectional view of an integrated circuit packaging system 1400 along a section line 14-14 of FIG. 15 in an eighth embodiment of the present invention. The integrated circuit packaging system 1400 can represent a configuration of a packaging system, which can include a pre-stacked package-on-package (PoP) structure with an underfill encapsulant formed by bottom side dispensing methods on a protruded interposer with a central opening.

The integrated circuit packaging system 1400 can be similar to the integrated circuit packaging system 800 of FIG. 8, except for the formation of the base integrated circuit package 802 of FIG. 8 and the stack substrate 830 of FIG. 8. The integrated circuit packaging system 1400 can include a base integrated circuit package 1402.

The base integrated circuit package 1402 can include a base substrate 1404, having a base substrate bottom surface 1406 and a base substrate top surface 1408, a base barrier 1410, a base integrated circuit 1412, and a base internal interconnect 1414. The base substrate 1404, the base barrier 1410, the base integrated circuit 1412, and the base internal interconnect 1414 can be formed in a manner similar to the base substrate 804 of FIG. 8, the base barrier 810 of FIG. 8, the base integrated circuit 812 of FIG. 8, and the base internal interconnect 814 of FIG. 8, respectively.

The base integrated circuit package 1402 can include a base second integrated circuit 1416, such as an integrated circuit die, a wirebond integrated circuit, or a chip, mounted over the base integrated circuit 1412. The base second integrated circuit 1416 can be attached to the base integrated circuit 1412 with an attach layer, such as a die attach, an adhesive, a film, or an epoxy. The base integrated circuit package 1402 can include a base second internal interconnect 1418, such as a bond wire, a ribbon bond wire, or a conductive wire, attached or connected to the base substrate top surface 1408 and the base second integrated circuit 1416.

The base integrated circuit package 1402 can include a base third integrated circuit 1420, such as an integrated circuit die, a wirebond integrated circuit, or a chip, mounted over the base second integrated circuit 1416. The base third integrated circuit 1420 can be attached to the base second integrated circuit 1416 with an attach layer, such as a die attach, an adhesive, a film, or an epoxy. The base integrated circuit package 1402 can include a base third internal interconnect 1422, such as a bond wire, a ribbon bond wire, or a conductive wire, attached or connected to the base substrate top surface 1408 and the base third integrated circuit 1420.

The base integrated circuit package 1402 can include a base encapsulation 1426, such as a cover including an epoxy molding compound, an encapsulant, or a molding material. The base encapsulation 1426 can be formed over the base substrate 1404, the base integrated circuit 1412, the base internal interconnect 1414, the base second integrated circuit 1416, the base second internal interconnect 1418, the base third integrated circuit 1420, and the base third internal interconnect 1422.

The integrated circuit packaging system 1400 can include a stack substrate 1430, having a stack substrate bottom surface 1432, a stack substrate top surface 1434, a stack substrate aperture 1436, and a stack substrate protrusion 1437. The stack substrate 1430 can be formed in a manner similar to the stack substrate 830 of FIG. 8, except that the stack substrate 1430 can include a stack substrate open region 1438 defined as a cavity, a window, a hole, or the central opening.

The stack substrate open region 1438 can be formed in the center of the stack substrate 1430. The stack substrate open region 1438 can be formed in order to create spacing for mold cap thickness of the base encapsulation 1426 or flip chip thickness of the base integrated circuit 1412, the base second integrated circuit 1416, or the base third integrated circuit 1420.

The stack substrate aperture 1436 can be formed adjacent or around the stack substrate open region 1438. The top or an upper portion of the base integrated circuit package 1402 can be positioned in the stack substrate open region 1438.

The integrated circuit packaging system 1400 can include an inter-substrate region 1456 and an inter-substrate connector 1458. The inter-substrate region 1456 and the inter-substrate connector 1458 can be formed in a manner similar to the inter-substrate region 856 of FIG. 8 and the inter-substrate connector 858 of FIG. 8, respectively.

The integrated circuit packaging system 1400 can include a top integrated circuit package 1464. The top integrated circuit package 1464 can include a top substrate 1466, having a top substrate bottom surface 1468 and a top substrate top surface 1470, a top integrated circuit 1474, a top internal interconnect 1476, a top second integrated circuit 1478, a top second internal interconnect 1480, and a top encapsulation 1482.

The top substrate 1466, the top integrated circuit 1474, the top internal interconnect 1476, the top second integrated circuit 1478, the top second internal interconnect 1480, and the top encapsulation 1482 can be formed in a manner similar to the top substrate 866 of FIG. 8, the top integrated circuit 874 of FIG. 8, the top internal interconnect 876 of FIG. 8, the top second integrated circuit 878 of FIG. 8, the top second internal interconnect 880 of FIG. 8, and the top encapsulation 882 of FIG. 8, respectively.

The integrated circuit packaging system 1400 can include a second inter-substrate region 1484, a second inter-substrate connector 1486, an external interconnect 1488, and a connector underfill 1490. The second inter-substrate region 1484, the second inter-substrate connector 1486, the external interconnect 1488, and the connector underfill 1490 can be formed in a manner similar to the second inter-substrate region 884 of FIG. 8, the second inter-substrate connector 886 of FIG. 8, the external interconnect 888 of FIG. 8, and the connector underfill 890 of FIG. 8, respectively.

Referring now to FIG. 15, therein is shown a top view of the integrated circuit packaging system 1400. The integrated circuit packaging system 1400 can include the top integrated circuit package 1464 mounted over the stack substrate top surface 1434. The integrated circuit packaging system 1400 can include a portion of the connector underfill 1490 dispensed over the stack substrate top surface 1434.

Figure 16:
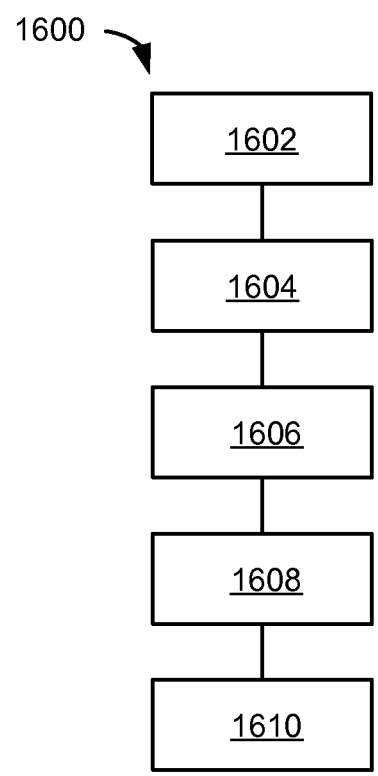
FIG. 16 is a flow chart of a method of manufacture of an integrated circuit packaging system in a further embodiment of the present invention.

Referring now to FIG. 16, therein is shown a flow chart of a method 1600 of manufacture of an integrated circuit packaging system in a further embodiment of the present invention. The method 1600 includes: providing a base substrate in a block 1602; attaching a base integrated circuit on the base substrate in a block 1604; attaching a base barrier on the base substrate adjacent a base perimeter thereof in a block 1606; mounting a stack substrate over the base substrate, the stack substrate having a stack substrate aperture with the stack substrate having an inter-substrate connector thereon in a block 1608; and dispensing a connector underfill through the stack substrate aperture encapsulating the inter-substrate connector, overflow of the connector underfill prevented by the base barrier in a block 1610.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a base integrated circuit package having a base integrated circuit on a base substrate thereof;
attaching a base barrier on the base substrate and adjacent a base perimeter of the base substrate;
mounting a stack substrate over the base substrate, the stack substrate having a stack substrate aperture with the stack substrate having an inter-substrate connector thereon; and
dispensing a connector underfill through the stack substrate aperture encapsulating the inter-substrate connector, overflow of the connector underfill prevented by the base barrier wherein surfaces of the connector underfill of the stack substrate, the stack substrate, and the base integrated circuit package form a cavity.

2. The method as claimed in claim 1 wherein mounting the stack substrate includes mounting the stack substrate having a stack barrier adjacent a stack perimeter thereof.

3. The method as claimed in claim 1 wherein dispensing the connector underfill includes dispensing the connector underfill adjacent the base barrier.

4. The method as claimed in claim 1 wherein dispensing the connector underfill includes dispensing the connector underfill between the base substrate and the stack substrate.

5. The method as claimed in claim 1 further comprising mounting a top integrated circuit package over the stack substrate, the entirety of the top integrated circuit package adjacent the stack substrate aperture.

6. A method of manufacture of an integrated circuit packaging system comprising:
providing a base integrated circuit package having a base integrated circuit on a base substrate thereof;
attaching a base barrier on the base substrate and adjacent a base perimeter of the base substrate;
mounting a stack substrate over the base substrate, the stack substrate having a stack substrate aperture with the stack substrate having an inter-substrate connector thereon and the inter-substrate connector between the base barrier and the base integrated circuit; and
dispensing a connector underfill through the stack substrate aperture encapsulating the inter-substrate connector, overflow of the connector underfill prevented by the base barrier wherein surfaces of the connector underfill of the stack substrate, the stack substrate, and the base integrated circuit package form a cavity.

7. The method as claimed in claim 6 wherein:
mounting the stack substrate includes mounting the stack substrate having a stack substrate protrusion; and
dispensing the connector underfill includes dispensing the connector underfill over a portion of the stack substrate protrusion.

8. The method as claimed in claim 6 further comprising removing a portion of the stack substrate and a portion of the connector underfill, an outer edge of the stack substrate substantially intersected by an extent of the connector underfill.

9. The method as claimed in claim 6 wherein mounting the stack substrate includes mounting the stack substrate having a stack substrate open region adjacent the stack substrate aperture.

10. The method as claimed in claim 6 wherein attaching the base integrated circuit on the base substrate includes attaching a flip chip on the base substrate.

11. An integrated circuit packaging system comprising:
- a base integrated circuit package having a base integrated circuit on a base substrate thereof;
- a base barrier on the base substrate and adjacent a base perimeter of the base substrate;
- a stack substrate over the base substrate, the stack substrate having a stack substrate aperture with the stack substrate having an inter-substrate connector thereon; and
- a connector underfill through the stack substrate aperture encapsulating the inter-substrate connector, overflow of the connector underfill prevented by the base barrier wherein surfaces of the connector underfill of the stack substrate, the stack substrate, and the base integrated circuit package form a cavity.

12. The system as claimed in claim 11 wherein the stack substrate includes the stack substrate having a stack barrier adjacent a stack perimeter thereof.

13. The system as claimed in claim 11 wherein the connector underfill is adjacent the base barrier.

14. The system as claimed in claim 11 wherein the connector underfill is between the base substrate and the stack substrate.

15. The system as claimed in claim 11 further comprising a top integrated circuit package over the stack substrate, the entirety of the top integrated circuit package adjacent the stack substrate aperture.

16. The system as claimed in claim 11 wherein the inter-substrate connector is between the base barrier and the base integrated circuit.

17. The system as claimed in claim 16 wherein the stack substrate includes a stack substrate protrusion, the connector underfill over a portion of the stack substrate protrusion.

18. The system as claimed in claim 16 wherein the connector underfill includes an outer edge of the stack substrate substantially intersected by an extent of the connector underfill.

19. The system as claimed in claim 16 wherein the stack substrate includes a stack substrate open region adjacent the stack substrate aperture.

20. The system as claimed in claim 16 wherein the base integrated circuit includes a flip chip on the base substrate.

* * * * *